(12) United States Patent
Kaneko et al.

(10) Patent No.: US 10,312,339 B2
(45) Date of Patent: Jun. 4, 2019

(54) SEMICONDUCTOR DEVICE

(71) Applicant: PANASONIC INTELLECTUAL PROPERTY MANAGEMENT CO., LTD., Osaka (JP)

(72) Inventors: Saichirou Kaneko, Kyoto (JP); Hiroto Yamagiwa, Hyogo (JP); Ayanori Ikoshi, Kyoto (JP); Masayuki Kuroda, Osaka (JP); Manabu Yanagihara, Osaka (JP); Kenichiro Tanaka, Osaka (JP); Tetsuyuki Fukushima, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/728,141

(22) Filed: Oct. 9, 2017

(65) Prior Publication Data

US 2018/0040706 A1    Feb. 8, 2018

Related U.S. Application Data

(60) Division of application No. 15/234,775, filed on Aug. 11, 2016, now Pat. No. 9,818,835, which is a division
(Continued)

(30) Foreign Application Priority Data

Apr. 25, 2013    (JP) .................................. 2013-092347

(51) Int. Cl.
*H01L 29/47*    (2006.01)
*H01L 21/28*    (2006.01)
(Continued)

(52) U.S. Cl.
CPC ............ *H01L 29/475* (2013.01); *H01L 21/28* (2013.01); *H01L 29/0619* (2013.01);
(Continued)

(58) Field of Classification Search
CPC ............. H01L 31/1075; H01L 31/1804; H01L 31/02327; H01L 31/022408; H01L 31/028;
(Continued)

(56) References Cited

U.S. PATENT DOCUMENTS 8,148,752 B2    4/2012    Ikoshi et al.
9,331,163 B2    5/2016    Koehler et al.
(Continued)

FOREIGN PATENT DOCUMENTS

JP    2004-200248 A    7/2004
JP    2007-096203 A    4/2007
(Continued)

OTHER PUBLICATIONS

International Search Report of PCT application No. PCT/JP2014/002184 dated Jun. 24, 2014.
(Continued)

*Primary Examiner* — Jarrett J Stark
(74) *Attorney, Agent, or Firm* — McDermott Will & Emery LLP

(57) ABSTRACT

In a semiconductor device in the present disclosure, a first nitride semiconductor layer has a two-dimensional electron gas channel in a vicinity of an interface with a second nitride semiconductor layer. In plan view, an electrode portion is provided between a first electrode and a second electrode with a space between the first electrode and the second electrode, and a space between the second electrode and the electrode portion is smaller than the space between the first electrode and the electrode portion. An energy barrier is
(Continued)

provided in a junction surface between the electrode portion and the second nitride semiconductor layer, the energy barrier indicating a rectifying action in a forward direction from the electrode portion to the second nitride semiconductor layer, and a bandgap of the second nitride semiconductor layer is wider than a bandgap of the first nitride semiconductor layer.

10 Claims, 24 Drawing Sheets

Related U.S. Application Data of application No. 14/884,815, filed on Oct. 16, 2015, which is a continuation of application No. PCT/JP2014/002184, filed on Apr. 17, 2014.

(51) Int. Cl.
| | | |
|---|---|---|
| *H01L 29/872* | (2006.01) | |
| *H01L 29/778* | (2006.01) | |
| *H01L 29/06* | (2006.01) | |
| *H01L 29/20* | (2006.01) | |
| *H01L 29/205* | (2006.01) | |
| *H01L 29/10* | (2006.01) | |
| *H01L 29/423* | (2006.01) | |

(52) U.S. Cl.
CPC ...... *H01L 29/1029* (2013.01); *H01L 29/2003* (2013.01); *H01L 29/205* (2013.01); *H01L 29/7786* (2013.01); *H01L 29/7787* (2013.01); *H01L 29/872* (2013.01); *H01L 29/1066* (2013.01); *H01L 29/42316* (2013.01)

(58) Field of Classification Search
CPC ..... H01L 31/107; H01L 31/18; G02B 6/1228; G02B 6/131; G02B 2006/12061
See application file for complete search history.

(56) References Cited

U.S. PATENT DOCUMENTS

| | | |
|---|---|---|
| 2006/0060871 A1 | 3/2006 | Beach |
| 2006/0102929 A1 | 5/2006 | Okamoto et al. |
| 2008/0248634 A1 | 10/2008 | Beach |
| 2009/0085027 A1 | 4/2009 | Jin et al. |
| 2009/0206363 A1 | 8/2009 | Machida et al. |
| 2010/0097105 A1 | 4/2010 | Morita et al. |
| 2010/0155780 A1 | 6/2010 | Machida et al. |
| 2011/0147811 A1 | 6/2011 | Kavalieros et al. |
| 2011/0215379 A1 | 9/2011 | Ikoshi et al. |
| 2011/0260217 A1 | 10/2011 | Okamoto et al. |
| 2011/0275183 A1 | 11/2011 | Beach |
| 2012/0126287 A1 | 5/2012 | Aoki |
| 2013/0256699 A1 | 10/2013 | Vielemeyer et al. |
| 2013/0277680 A1 | 10/2013 | Green et al. |
| 2014/0061659 A1 | 3/2014 | Teplik et al. |
| 2014/0191242 A1 | 7/2014 | Nie et al. |
| 2015/0060942 A1 | 3/2015 | Kume et al. |
| 2015/0187932 A1 | 7/2015 | Lin et al. |
| 2015/0340483 A1 | 11/2015 | Briere |
| 2016/0086938 A1 | 3/2016 | Kinzer |

FOREIGN PATENT DOCUMENTS

| | | |
|---|---|---|
| JP | 2008-034438 A | 2/2008 |
| JP | 2008-270847 A | 11/2008 |
| JP | 2009-200149 A | 9/2009 |
| JP | 2010-147387 A | 7/2010 |
| JP | 2010-278333 A | 12/2010 |
| JP | 2011-181743 A | 9/2011 |
| JP | 2012-109492 A | 6/2012 |
| JP | 2013-038239 A | 2/2013 |
| WO | 2008/062800 A1 | 5/2008 |
| WO | 2010-082272 A1 | 7/2010 |

OTHER PUBLICATIONS

Non-Final Office Action issued in U.S. Appl. No. 15/234,775, dated Mar. 31, 2017.
Notice of Allowance issued in U.S. Appl. No. 15/234,775, dated Jul. 12, 2017.
Non-Final Office Action issued in U.S. Appl. No. 14/884,815, dated May 12, 2016.

SEMICONDUCTOR DEVICE

RELATED APPLICATIONS

This application is a Divisional application of U.S. patent application Ser. No. 15/234,775, filed on Aug. 11, 2016, which is a Divisional application of U.S. patent application Ser. No. 14/884,815, filed on Oct. 16, 2015, which is a Continuation of International Patent Application No. PCT/JP2014/002184, filed on Apr. 17, 2014, which in turn claims the benefit of Japanese Application No. 2013-092347, filed on Apr. 25, 2013, the disclosures of which Applications are incorporated by reference herein.

BACKGROUND OF THE INVENTION

Field of the Invention

The present disclosure relates to a semiconductor device, and more particularly, to a semiconductor device using a nitride to be used in circuits such as an inverter and a power supply circuit.

Description of the Related Art

A group III-V nitride compound semiconductor represented by gallium nitride (GaN), that is, a so-called nitride semiconductor has attracted attention. The nitride semiconductor is a compound semiconductor made of aluminum (Al), gallium (Ga) and indium (In) belonging to the group III, and nitrogen (N) belonging to the group V, and expressed by a general formula of $In_xGa_yAl_{1-x-y}N$ ($0 \leq x \leq 1$, $0 \leq y \leq 1$, $x+y \leq 1$).

With the nitride semiconductor, various mixed crystals can be formed and a hetero junction interface can be easily formed. In the hetero junction of the nitride semiconductor, a two-dimensional electron gas layer (2DEG layer) having a high concentration is generated in a junction interface through spontaneous polarization or piezoelectric polarization even in an undoped state. Thus, attention has been increasingly focused on a field effect transistor (FET) and a Schottky barrier diode (SBD) used as a high frequency or high power device in which this high-concentration 2DEG layer is used as a carrier layer.

However, a phenomenon called current collapse is likely to occur in the FET or SBD using the nitride semiconductor. The current collapse is the phenomenon in which when the device is turned on after it has been turned off once, a drain current is not likely to flow for a given length of time. Due to the current collapse, it is difficult to perform a switching operation at high speed, which causes extremely serious problems in a device operation.

As a method to prevent this current collapse from occurring, it is proposed to relax an electric field generated inside the device when a high voltage is applied to the device. For example, there is a method to relax an electric field at a gate end by forming a gate field plate in the FET (refer to Patent Literature 1).

Furthermore, it is said that along with relaxing the electric field, it is favorable to form a SiN protective film on an uppermost layer of a nitride semiconductor layer. This is because, when the SiN film is formed, it is possible to reduce a defect of an interface between the protective film and the nitride semiconductor layer, and prevent electrons from being trapped by the defect due to an intense electric field.

CITATION LIST

Patent Literature

PL1: Unexamined Japanese Patent Publication No. 2004-200248

However, it is difficult to sufficiently prevent the collapse phenomenon only by providing the gate field plate. This is because, the collapse phenomenon cannot be sufficiently prevented only by relaxing the electric field at the gate end, and it is also necessary to relax an electric field at a drain end; however, the electric field cannot be sufficiently relaxed at the drain end in the above patent literature.

Furthermore, in a case where a voltage as high as several 100 V is applied as in the case of a switching element of the power device, a nitrogen defect in an interface between the SiN protective film and the nitride semiconductor layer cannot be sufficiently reduced only by forming the SiN protective film, so that the collapse phenomenon cannot be sufficiently prevented.

As a result, when the FET is changed from an off-state to an on-state, on-resistance becomes several times higher than that in an initial state for several µ seconds just after the state has been changed.

SUMMARY OF THE INVENTION

An object of the present disclosure is to solve the above problems and to prevent a current collapse from occurring in a semiconductor device composed of a nitride semiconductor.

In order to solve the above problems, according to a semiconductor device in an aspect of the present disclosure, a first nitride semiconductor layer has a two-dimensional electron gas channel in a vicinity of an interface with a second nitride semiconductor layer. In plan view, an electrode portion is provided between a first electrode and a second electrode with a space, and a space between the second electrode and the electrode portion is smaller than a space between the first electrode and the electrode portion. An energy barrier is provided in a junction surface between the electrode portion and the second nitride semiconductor layer, the energy barrier indicating a rectifying action in a forward direction from the electrode portion to the second nitride semiconductor layer, and a bandgap of the second nitride semiconductor layer is wider than a bandgap of the first nitride semiconductor layer. A potential of the electrode portion is substantially equal to a potential of the second electrode, and while a maximum operating voltage, which renders the first electrode positive, is applied to between the first electrode and the second electrode, a conductive state is provided in the two-dimensional electron gas channel under the electrode portion.

The semiconductor device in the aspect of the present disclosure includes the electrode portion, so that electrons trapped in a lower part of the electrode portion can be absorbed, or electrons can be recombined with holes injected from the electrode portion. Therefore, compared with a semiconductor device not including the electrode portion, the electrons are less trapped at an end of the second electrode, and an electric field can be relaxed at the end of the second electrode, so that the current collapse can be prevented from occurring.

According to the nitride semiconductor transistor in the aspect of the present disclosure, the semiconductor device made of the nitride semiconductor material can prevent the current collapse, and can be applied to a power transistor and a diode.

DETAILED DESCRIPTION OF PREFERRED EXEMPLARY EMBODIMENTS

Figure 1:
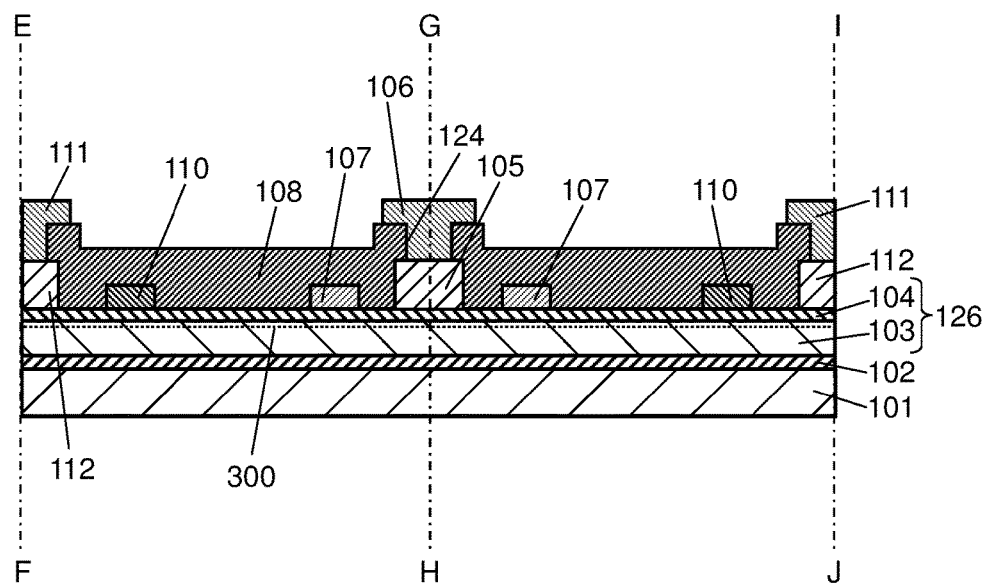
FIG. 1 is a cross-sectional view of a semiconductor device according to a first exemplary embodiment of the present disclosure.

Hereinafter, exemplary embodiments of the present disclosure will be described with reference to the drawings.
First Exemplary Embodiment FIG. 1 is a cross-sectional view of a semiconductor device according to the first exemplary embodiment of the present disclosure. In addition, this semiconductor device is a field effect transistor (FET).

The semiconductor device shown in FIG. 1 includes silicon substrate 101 having a plane orientation of (111) on a main surface, and a thickness of 350 μm, and semiconductor layer stacked body 126 formed on silicon substrate 101 and composed of first nitride semiconductor layer 103, and second nitride semiconductor layer 104 having a bandgap wider than first nitride semiconductor layer 103, with buffer layer 102 interposed between semiconductor layer stacked body 126 and silicon substrate 101. First nitride semiconductor layer 103 has two-dimensional electron gas channel 300 in a vicinity of an interface with second nitride semiconductor layer 104.

In addition, gate electrode 110, first electrode 112 serving as a source electrode, second electrode 105 serving as a drain electrode, and electrode portion 107 having a Schottky junction are formed on semiconductor layer stacked body 126. Furthermore, interlayer insulating film 108 is formed on semiconductor layer stacked body 126, gate electrode 110, first electrode 112, second electrode 105, and electrode portion 107. An opening is formed in interlayer insulating film 108 so as to correspond to a position of first electrode 112, and first electrode wiring line 111 is formed in this opening. Furthermore, an opening is formed in interlayer insulating film 108 so as to correspond to a position of second electrode 105, and second electrode wiring line 106 is formed in this opening. Furthermore, semiconductor layer stacked body 126 is formed by a metalorganic vapor phase epitaxy (MOVPE) method, for example, and a main surface of the semiconductor layer in semiconductor layer stacked body 126 has a plane orientation of (0001).

Here, buffer layer 102 has a multilayer structure composed of an AlN layer and an AlGaN layer formed on silicon substrate 101. Buffer layer 102 has a total thickness of about 2.1 μm.

First nitride semiconductor layer 103 is a channel layer for electron transition, made of undoped GaN, and has a thickness of 1.6 μm. Here, "undoped" means that an impurity is not introduced intentionally.

Second nitride semiconductor layer 104 is an electron supply layer, made of undoped $Al_{0.17}Ga_{0.83}N$, and has a thickness of 60 nm.

Two-dimensional electron gas channel 300 is formed in an interface between first nitride semiconductor layer 103 and second nitride semiconductor layer 104. In addition, a two-dimensional electron gas is occasionally referred to as 2DEG.

Each of first electrode 112 and second electrode 105 has a configuration in which an aluminum layer having a thickness of 200 nm is formed on a titanium layer having a thickness of 20 nm formed on second nitride semiconductor layer 104 (so-called Ti/Al configuration). Furthermore, each of first electrode 112 and second electrode 105 makes an ohmic contact with second nitride semiconductor layer 104.

Gate electrode 110 has a configuration in which a gold layer having a thickness of 200 nm is formed on a nickel layer having a thickness of 100 nm formed on second nitride semiconductor layer 104 (so-called Ni/Au configuration).

Gate electrode 110 makes a Schottky contact with second nitride semiconductor layer 104.

Electrode portion 107 is made of metal which forms a Schottky junction with second nitride semiconductor layer 104. More specifically, an energy barrier is formed in a junction surface between electrode portion 107 and second nitride semiconductor layer 104 to perform a rectifying action in a forward direction from electrode portion 107 to second nitride semiconductor layer 104. Here, a gold layer having a thickness of 200 nm is formed on a nickel layer having a thickness of 100 nm formed on second nitride semiconductor layer 104.

Interlayer insulating film 108 is composed of a silicon nitride film (SiN film) having a thickness of 1 μm. Interlayer insulating film 108 is formed by a chemical vapor deposition (CVD) method, for example.

Each of first electrode wiring line 111 and second electrode wiring line 106 is made of copper and has a thickness of 6 μm.

In addition, each of gate electrode 110, first electrode 112, second electrode 105, and electrode portion 107 has a finger structure (not shown), and one finger of the electrode has a length of 500 μm (a length perpendicular to a sheet surface in FIG. 1). In addition, first electrode 112 has a width of 5 μm (width included in the plane orientation of (0001) and along the sheet surface in FIG. 1), and second electrode 105 has a width of 11 μm. In addition, gate electrode 110 has a width of 1 μm (that is, a gate length), and electrode portion 107 has a width of 2 μm.

A distance between first electrode 112 and second electrode 105 (a distance between opposed electrode ends) is 20 μm. Gate electrode 110 is provided 1.5 μm away from an end, which faces gate electrode 110, of first electrode 112, and electrode portion 107 is provided 1.5 μm away from an end, which faces electrode portion 107, of second electrode 105.

The semiconductor device shown in FIG. 1 has a configuration in which electrode portions 107, gate electrodes 110, and first electrodes 112 are symmetrically disposed with respect to second electrode 105. That is, as for an electrode arrangement in FIG. 1, first electrode 112, gate electrode 110, electrode portion 107, second electrode 105, electrode portion 107, gate electrode 110 and first electrode 112 are sequentially formed from a left side.

In addition, the semiconductor device also has a configuration in which gate electrodes 110, electrode portions 107, and second electrodes 105 are symmetrically disposed with respect to first electrode 112. In FIG. 1, with respect to each of line E-F, line G-H, and line I-J, the electrodes are disposed in a linearly symmetrical manner.

In addition, in a whole semiconductor device (one chip), lengths (total length) of gate electrode 110, first electrode 112, second electrode 105, and electrode portion 107 is 20 μm.

The semiconductor device has a withstand voltage of 600 V.

The configuration of the semiconductor device is listed in Table 1.

TABLE 1

| | Material or composition | Conductivity type | Thickness |
|---|---|---|---|
| Silicon substrate 101 | Si | — | 350 μm |
| Buffer layer 102 | Stacked structure of AlN and AlGaN | Undoped | Total thickness of 2.1 μm |

TABLE 1-continued

| | Material or composition | Conductivity type | Thickness |
|---|---|---|---|
| First nitride semiconductor layer 103 | GaN | Undoped | 1.6 μm |
| Second nitride semiconductor layer 104 | $Al_{0.18}Ga_{0.82}N$ | Undoped | 60 nm |

| | Material or composition | Thickness | Electrode width | Electrode length (finger length) |
|---|---|---|---|---|
| First electrode 112 | Ti/Al | Ti: 20 nm, Al: 200 nm | 5 μm | 500 μm |
| Second electrode 105 | Ti/Al | Ti: 20 nm, Al: 200 nm | 11 μm | 500 μm |
| Gate electrode 110 | Ni/Au | Ni: 100 nm, Au: 200 nm | 1 μm | 500 μm |
| Electrode portion 107 | Ni/Au | Ni: 100 nm, Au: 200 nm | 2 μm | 500 μm |

| | Material or composition | Thickness |
|---|---|---|
| First electrode wiring 111 | Cu | 6 μm |
| Second electrode wiring 106 | Cu | 6 μm |

| | Material or composition | Thickness |
|---|---|---|
| Interlayer insulating film 109 | SiN | 1 μm |

Here, as for a structure composed of electrode portion 107 and semiconductor layer stacked body 126 provided under electrode portion 107 when a maximum operating voltage, which renders the first electrode 112 positive, is applied between first electrode 112 and second electrode 105, a conductive state is provided in two-dimensional gas channel 300 under electrode portion 107.

More specifically, according to the structure, second nitride semiconductor layer 104 is formed thickly to the extent that a current is not interrupted when the current flows between first electrode 112 and second electrode 105.

With this configuration, the channel does not become a pinch-off state under electrode portion 107, so that reverse conduction can be provided from first electrode 112 to second electrode 105.

In addition, electrode portion 107 and second electrode 105 are electrically connected to each other, and this electrically connected structure will be described below.

Hereinafter, an operation of the field effect transistor in the present disclosure shown in FIG. 1 will be described with reference to FIG. 2.

Figure 2:
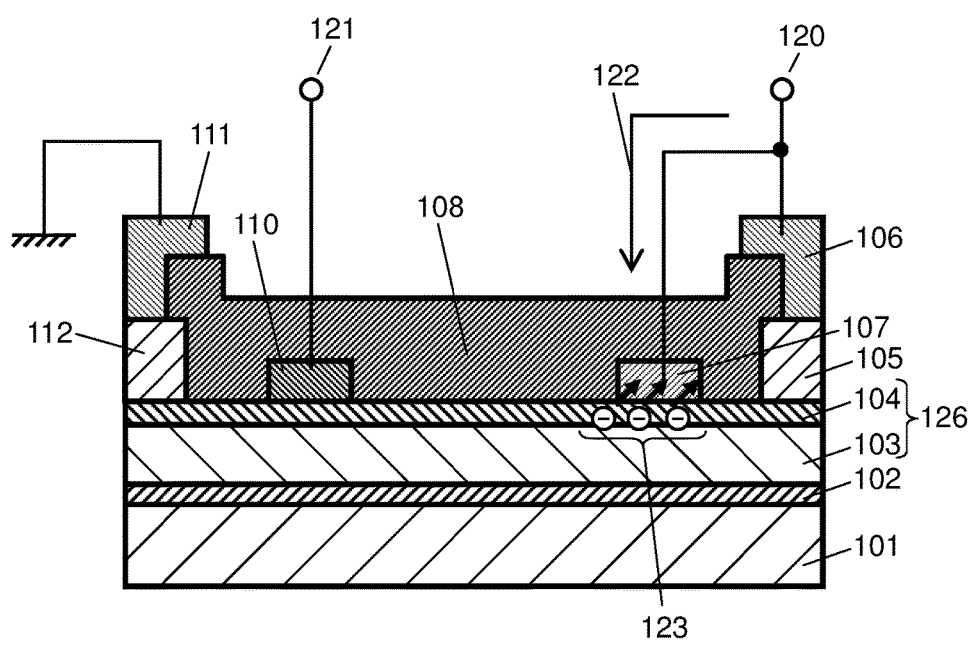
FIG. 2 is a cross-sectional view showing an operation of the semiconductor device according to the first exemplary embodiment of the present disclosure.

In addition, FIG. 2 is a cross-sectional view of a unit cell corresponding to a region from line E-F to line G-H in FIG. 1. As for an actual field effect transistor, the unit cell in FIG. 2 which corresponds to the part from line E-F to line G-H in FIG. 1 is repeatedly disposed in a linearly symmetrical manner.

The operation of the field effect transistor (FET) in the present disclosure will be described. A positive bias (hereinafter, referred to as the drain voltage) is applied to between drain terminal 120 and first electrode 112 serving as the source electrode (and first electrode wiring line 111), and a voltage equal to or higher than a gate threshold voltage of the FET is applied to gate terminal 121. Consequently, a current (hereinafter, referred to as the drain current) flows from second electrode 105 serving as the drain electrode to first electrode 112 through two-dimensional electron gas channel 300 formed in the vicinity of the interface between first nitride semiconductor layer 103 and second nitride semiconductor layer 104.

Meanwhile, the voltage of gate terminal 121 is reduced to be equal to or lower than the gate threshold voltage of the FET. For example, gate terminal 121 forms a short circuit with first electrode 112. Consequently, in a case where the gate threshold voltage is positive, the drain current does not flow.

Thus, by turning on/off the voltage applied to gate terminal 121, the drain current flows or does not flow in the FET, so that a switching operation is performed.

The switching operation is performed while an inductance load (hereinafter, referred to as the L load) is connected to the drain terminal of the FET. Consequently, at the moment the voltage is turned on and off, the drain voltage excessively rises from several 10 V to several 100 V in some cases with the voltage equal to or higher than the gate threshold voltage being applied to gate terminal 121. Thus, when the drain voltage rises in this way under the gate bias condition in which the drain current flows, an electron current flows in an intense electric field region near second electrode 105. Consequently, due to the intense electric field, electrons 123 are trapped in a defect in second nitride semiconductor layer 104 or an interface state generated between interlayer insulating film 108 and second nitride semiconductor layer 104.

In addition, a value of the L load ranges from 10 μH to 5 mH, for example, but the value varies depending on an output or input voltage of the semiconductor device.

In addition, the switching operation is performed at a frequency ranging from 20 kHz for an inverter to 200 kHz for a power factor correction (PFC) or 500 kHz for an LLC, for example. The drain voltage to be applied ranges from a direct current (DC) of 140 V to 400 V, for example. The gate voltage to be applied is between 0 V (off time) and 3.5 V (on time), for example, but a voltage may be applied in such a way that a spike voltage is generated at the moment of turning on or turning off.

According to a conventional FET, if the switching operation is continued while electrons 123 are kept trapped, scattering is caused in the channel because trapped electrons 123 are negatively charged, so that electron mobility is lowered, and on-resistance is increased. In addition, electric field concentration toward the drain occurs due to trapped electrons 123, so that an insulation breakdown occurs, that is, so-called current collapse occurs.

Meanwhile, since the FET of the present disclosure includes electrode portion 107 composed of a Schottky electrode. Therefore, trapped electrons 123 are mostly absorbed by electrode portion 107 and not left in second nitride semiconductor layer 104, so that the current collapse which is the problem in the conventional FET is not caused.

More specifically, in electrode portion 107, when the drain voltage is applied to second electrode 105 with respect to first electrode 112 with the voltage equal to or higher than the gate threshold voltage being applied to gate electrode 110, a potential difference between electrode portion 107 and second nitride semiconductor layer 104 just under electrode portion 107 becomes equal to or greater than an energy barrier formed between electrode portion 107 and second nitride semiconductor layer 104, so that Schottky current 122 flows from electrode portion 107 to first electrode 112.

With this configuration, even when the drain voltage excessively rises from several 10 V to several 100 V occasionally with the voltage equal to or higher than the gate threshold voltage being applied to gate terminal 121, electrons 123 trapped under electrode portion 107 can be absorbed by electrode portion 107. Thus, since there is no electrons trapped at the end of second electrode 105, on-resistance is prevented from being increased, and the electric field concentration can be relaxed, so that the current collapse can be prevented from occurring in the FET according to the present disclosure.

In addition, according to the structure composed of electrode portion 107 and semiconductor layer stacked body 126 provided under electrode portion 107 in the FET in the present disclosure, when a negative voltage (reverse bias) is applied between first electrode 112 and second electrode 105, that is, a negative voltage is applied to second electrode 105 with respect to first electrode 112, the conductive state is provided in two-dimensional electron gas channel 300 provided under electrode portion 107. That is, second nitride semiconductor layer 104 has a thickness of 60 nm which is relatively larger than a general FET composed of AlGaN/GaN, to the extent that the current is not prevented from flowing between first electrode 112 and second electrode 105.

Therefore, even when the negative voltage is applied to second electrode 105 with respect to first electrode 112, the channel does not become the pinch-off state under electrode portion 107, so that the reverse conduction can be provided from first electrode 112 to second electrode 105.

In addition, the thickness of second nitride semiconductor layer 104 is 60 nm in the above description, but is not limited thereto, and the thickness may range from 15 nm to 100 nm.

Furthermore, second nitride semiconductor layer 104 located under gate electrode 110 and electrode portion 107 may have a locally thinned and recessed structure. When second nitride semiconductor layer 104 located under gate electrode 110 has the recessed structure, the FET in the present disclosure is likely to show a normally-off characteristic in which a current does not flow when the gate voltage is zero bias, which is the favorable characteristic in view of a safe operation of a power transistor. Meanwhile, as for second nitride semiconductor layer 104 located under electrode portion 107, the recessed structure is to be provided to the extent that second nitride semiconductor layer 104 is kept thick to prevent the channel from becoming the pinch-off state, so that it is possible to reduce an unnecessary current component which does not contribute to improving the current collapse among components of Schottky current 122.

In addition, semiconductor layer stacked body 126 under first electrode 112 and second electrode 105 may also have a recessed structure. When semiconductor layer stacked body 126 has the recessed structure, first electrode 112 and second electrode 105 can directly contact with two-dimensional electron gas channel 300, so that ohmic contact resistance which is parasitic resistance can be reduced in the FET in the present disclosure, which is advantageous to a high-speed operation.

Figure 3A:
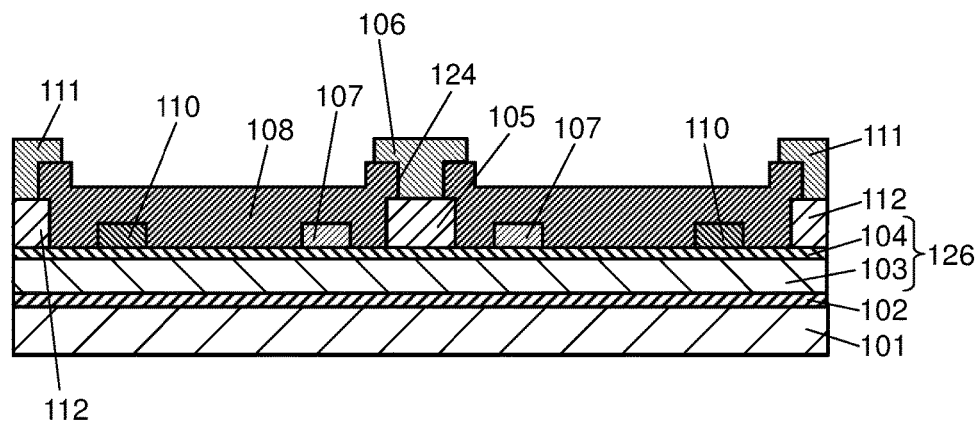
FIG. 3A is a cross-sectional view showing the semiconductor device according to the first exemplary embodiment of the present disclosure.
Figure 3B:
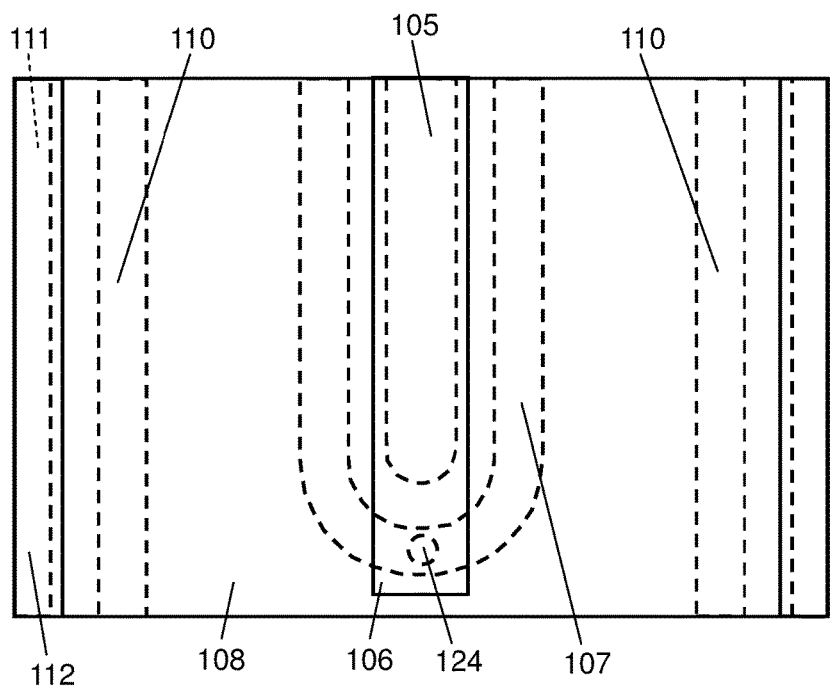
FIG. 3B is a perspective view showing the semiconductor device taken from above according to the first exemplary embodiment of the present disclosure.

Next, FIG. 3A is a cross-sectional view of the semiconductor device (FET) of the present disclosure shown in FIG. 1, and FIG. 3B is a plan view from above of the semiconductor device (FET) of the present disclosure shown in FIG. 1. In addition, FIG. 3B shows a vicinity of a connection portion between second electrode wiring line 106 and electrode portion 107.

Interlayer insulating film 108 is made of silicon nitride (SiN) and formed to cover second electrode 105. The opening is formed in interlayer insulating film 108, and second electrode wiring line 106 is formed in the opening while being connected to second electrode 105.

When second electrode wiring line 106 is provided, resistance of second electrode 105 and a wiring line connected to second electrode 105 can be reduced.

Furthermore, as shown in FIGS. 3A and 3B, second electrode 105 is surrounded by electrode portion 107, and via hole 124 is formed at an intersection of second electrode wiring line 106 and electrode portion 107, in interlayer insulating film 108 so that second electrode wiring line 106 is connected to electrode portion 107.

Here, second electrode 105 and electrode portion 107 are apart from each other at a certain distance, so that via hole 124 is needed, and second electrode wiring line 106 is connected to electrode portion 107 through via hole 124. Second electrode 105 and electrode portion 107 are spaced from each other, and a potential difference is thereby easily provided between second electrode 105 and electrode portion 107.

With this configuration, since second electrode 105 is surrounded by electrode portion 107, electrode portion 107 can be inevitably disposed in a channel of a current flowing from first electrode 112 to second electrode 105, so that the current collapse can be surely prevented.

In addition, compared with a case where an opening is formed in a whole region of the electrode portion to be used for connection to second electrode wiring line 106, it is not necessary to form the opening in electrode portion 107, so that electrode portion 107 can be narrowly formed.

Furthermore, electrode portion 107 has an arc-shape end, and this arc is a quarter of a circle (90° arc), and this end is connected to electrode portions 107 which are adjacent to each other across second electrode 105 so as to surround second electrode 105.

Here, a radius of this arc corresponds to a length from a center of second electrode wiring line 106 to the end of electrode portion 107, on a side closer to gate electrode 110.

Furthermore, the end of electrode portion 107 may have various shapes other than the arc shape, such as a rectangle, hexagon, or ellipse depending on the arrangement of the semiconductor device. In addition, the radius of the arc is not limited to the length from the center of second electrode wiring line 106 to the end of electrode portion 107 on the side closer to gate electrode 110, and its value may vary depending on the arrangement of the semiconductor device.

Furthermore, second electrode 105 and electrode portion 107 are spaced from each other at a certain distance in the above description, but second electrode 105 and electrode portion 107 may be in contact with each other depending on the configuration of the semiconductor device.

Furthermore, second electrode wiring line 106 favorably has a projecting length which does not reach electrode portion 107. In this exemplary embodiment, the projecting length of second electrode wiring line 106 is up to 3 μm from the end of second electrode 105.

A reason why second electrode wiring line 106 favorably has the projecting length which does not reach electrode portion 107 will be described below.

Figure 4:
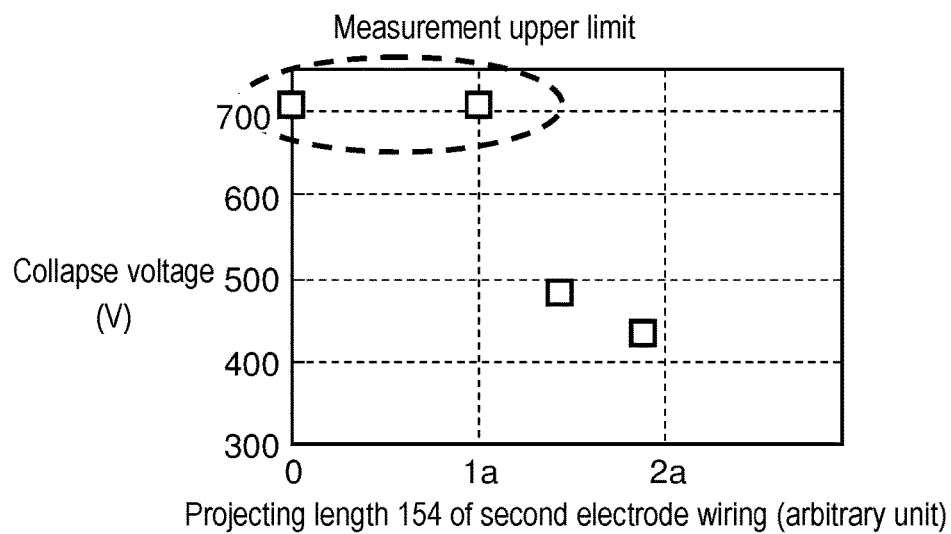
FIG. 4 is a view showing a relationship between a projecting length of the second electrode wiring line and a collapse voltage in the semiconductor device according to the first exemplary embodiment of the present disclosure.
Figure 5:
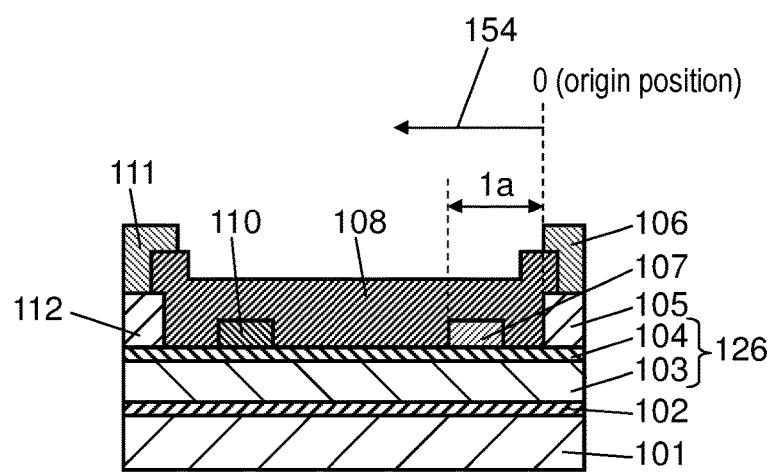
FIG. 5 is a view for describing the projecting length of the second electrode wiring line in the semiconductor device according to the first exemplary embodiment of the present disclosure.

FIG. 4 shows a graph illustrating a relationship between the projecting length of second electrode wiring line 106 and a collapse voltage, and FIG. 5 shows an explanatory diagram on the projecting length of second electrode wiring line 106.

The projecting length of second electrode wiring line 106 means a length of second electrode wiring line 106 projecting from second electrode 105 to first electrode 112 as shown by 154 in FIG. 5.

In addition, the collapse voltage in FIG. 4 is the drain voltage whose on-resistance starts rising when the switching operation is performed with the drain connected to the L load in the FET.

As shown in FIG. 4, the inventors of the present disclosure have found through experiments that when projecting length 154 of second electrode wiring line 106 exceeds length 1a at the end of electrode portion 107, the collapse voltage considerably drops. This is considered due to the fact that when projecting length 154 of second electrode wiring line 106 projects beyond electrode portion 107, a potential difference is not likely to be formed between electrode portion 107 and second nitride semiconductor layer 104 just under the electrode portion.

That is, when projecting length 154 of electrode wiring line 106 is greater than length 1a, the potential difference does not become equal to or higher the energy barrier even when the drain voltage is increased, so that the trapped electrons cannot be absorbed by electrode portion 107.

As described above, according to this exemplary embodiment, it is found that second electrode wiring line 106 is favorably formed inside electrode portion 107 with respect to a direction to first electrode 112.

Variation 1

Figure 6A:
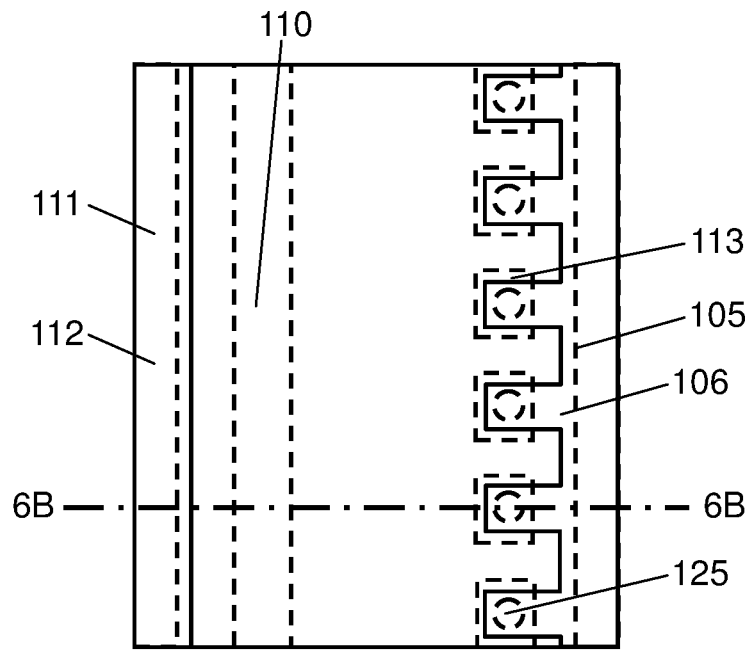
FIG. 6A is a perspective view showing a semiconductor device taken from above according to Variation 1 of the first exemplary embodiment of the present disclosure.
Figure 6B:
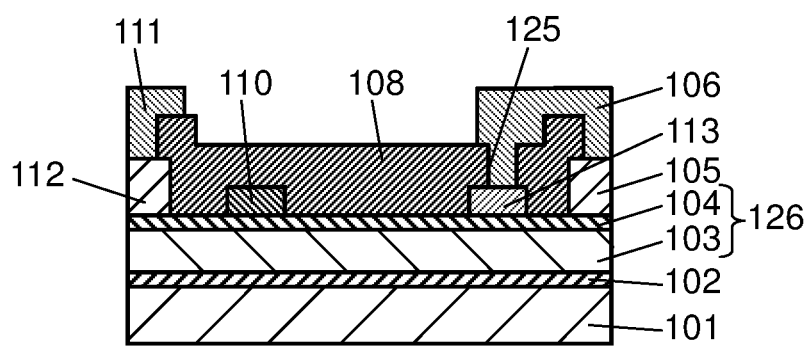
FIG. 6B is a cross-sectional view showing the semiconductor device according to Variation 1 of the first exemplary embodiment of the present disclosure.

FIGS. 6A and 6B are a plan view and a cross-sectional view taken along a line 6B-6B in FIG. 6A, respectively showing a FET in Variation 1 of this exemplary embodiment.

In addition, FIGS. 6A and 6B are the plan view and the cross-sectional view, respectively showing a unit cell corresponding to the semiconductor device from line E-F to line G-H in FIG. 1. As for an actual field effect transistor, the unit cell in FIGS. 6A and 6B which correspond to the part from line E-F to line G-H in FIG. 1 is repeatedly disposed in a linearly symmetrical manner.

A semiconductor device in Variation 1 in FIGS. 6A and 6B differs from the semiconductor device in FIGS. 3A and 3B in that plurality of island-shaped electrode portions 113 are separately formed so as to be spaced from each other.

Via holes 125 are formed just above island-shaped electrode portions 113 in interlayer insulating film 108, and second electrode wiring line 106 is formed to stride over island-shaped electrode portions 113 so that second electrode wiring line 106 is connected to electrode portions 113 through island-shaped via holes 125.

In addition, the same contents in Table 1 are applied to materials, compositions, thicknesses of silicon substrate 101, buffer layer 102, first nitride semiconductor layer 103, second nitride semiconductor layer 104, second electrode 105, second electrode wiring line 106, interlayer insulating film 108, gate electrode 110, first electrode wiring line 111, and first electrode 112.

In addition, electrode portion 113 has a configuration in which a gold layer having a thickness of 200 nm is formed on a nickel layer having a thickness of 100 nm. Electrode portion 113 has a size of 4 μm.

Via hole 125 has a size of 2.5 μm, and a depth of 1 μm which is the same as the thickness of interlayer insulating film 108.

In this case, since island-shaped electrode portions 113 are formed, a current flowing between first electrode 112 and second electrode 105 also flows in a channel other than a channel under electrode portion 113. As a result, when a forward bias is applied to second electrode 105, a current flows around a depletion layer spreading under electrode portion 113, so that a larger current can flow into first electrode 112.

In addition, in the case where the current flowing between first electrode 112 and second electrode 105 flows in the channel other than the channel just under electrode portion 113, when a reverse bias is applied to second electrode 105, a larger current can flow into second electrode 105.

Hereinafter, FIGS. 7 to 13A each show a cross sectional view of a unit cell corresponding to the part from line E-F to line G-H in FIG. 1. As for an actual field effect transistor, the unit cell in each of FIGS. 7 to 13A which corresponds to the part from line E-F to line G-H in FIG. 1 is repeatedly disposed in a linearly symmetrical manner.

Variation 2

Figure 7:
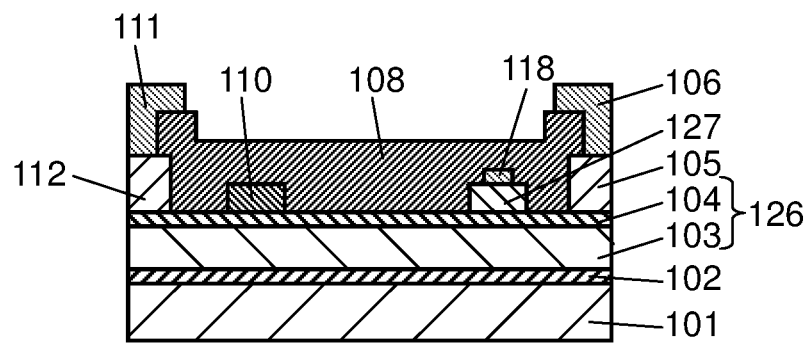
FIG. 7 is a cross-sectional view showing a semiconductor device according to Variation 2 of the first exemplary embodiment of the present disclosure.

FIG. 7 shows a cross-sectional view of an FET in Variation 2 of this exemplary embodiment.

This FET differs from the FET shown in FIG. 1 in that p-third nitride semiconductor layer 127 is formed instead of electrode portion 107 serving as the Schottky electrode. Other configurations including the finger structure are the same as those of the FET shown in the first exemplary embodiment (refer to FIGS. 1, 2, 3A, and 3B, and Table 1).

More specifically, third nitride semiconductor layer 127 has a thickness of 200 nm and is made of Mg-doped p-GaN having an impurity concentration of $1 \times 10^{20}$ cm$^{-3}$. In addition, third nitride semiconductor layer 127 has a length of 500 μm (length in a direction perpendicular to a sheet surface in FIG. 7), and a width of 2 μm (width in a direction along the sheet surface in FIG. 7).

Drain connection electrode 118 made of palladium (Pd) is formed on third nitride semiconductor layer 127, and makes an ohmic contact with third nitride semiconductor layer 127.

When third nitride semiconductor layer 127 is provided as the p-nitride semiconductor layer, and holes are injected from third nitride semiconductor layer 127, the holes can be recombined with electrons trapped in semiconductor layer stacked body 126 under third nitride semiconductor layer 127.

According to verification by the inventors of the present disclosure on this effect, it has been confirmed that in the case where the trapped electrons are recombined with the holes injected from the p-nitride semiconductor layer, compared with the case where the FET has electrode portion 107 composed of the Schottky electrode in FIG. 1, the current collapse can be equally or more highly prevented.

More specifically, on-resistance does not rise even at 700 V similar to the FET in FIG. 1.

Furthermore, third nitride semiconductor layer 127 may be made of $Al_xGa_{1-x}N$ ($0<x\le1$) or $In_yAl_zGa_{1-y-z}N$ ($0\le y\le1$, $0\le z\le1$) instead of GaN. Furthermore, the Mg impurity concentration may be about $1\times10^{18}$ cm$^{-3}$ to $1\times10^{21}$ cm$^{-3}$. Third nitride semiconductor layer 127 may have a width of 1 μm to 3 μm, depending on a distance between second electrode 105 and gate electrode 110.

Furthermore, drain connection electrode 118 does not necessarily make the ohmic contact, and the current collapse can be effectively prevented even in a case where drain connection electrode 118 is a metal stacked body composed of titanium (Ti) and aluminum (Al), and makes a Schottky contact with p-third nitride semiconductor layer 127.

Third nitride semiconductor layer 127 composed of the p-nitride semiconductor layer is configured such that when a voltage is applied to second electrode 105 with respect to first electrode 112 while a voltage equal to or higher than a gate threshold voltage is applied to gate electrode 110, a potential difference between third nitride semiconductor layer 127 and second nitride semiconductor layer 104 just under third nitride semiconductor layer 127 becomes equal or greater than an energy barrier formed between third nitride semiconductor layer 127 and second nitride semiconductor layer 104, and a current flows from third nitride semiconductor layer 127 to first electrode 112.

Third nitride semiconductor layer 127 has the p-conductivity in the above description, but it may have an n-conductivity instead of the p-conductivity. In the case of having the n-conductivity, the trapped electrons are absorbed by third nitride semiconductor layer 127, and the current collapse can be effectively prevented similar to the first exemplary embodiment provided with electrode portion 107 in FIG. 1. Hereinafter, this will be described in Variation 3.

Variation 3

Figure 8:
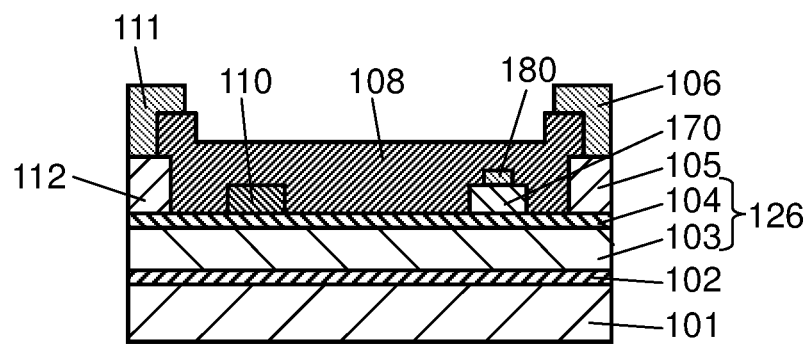
FIG. 8 is a cross-sectional view showing a semiconductor device according to Variation 3 of the first exemplary embodiment of the present disclosure.

FIG. 8 is a cross-sectional view of an FET in Variation 3 of this exemplary embodiment.

This FET differs from the FET shown in FIG. 1 in that n-third nitride semiconductor layer 170 is formed instead of electrode portion 107 serving as the Schottky electrode. Other configurations including the finger structure are the same as those of the FET shown in the first exemplary embodiment (refer to FIGS. 1, 2, 3A, and 3B, and Table 1).

More specifically, n-third nitride semiconductor layer 170 is composed of Si-doped n-GaN layer having a Si impurity concentration of $1\times10^{15}$ cm$^{-3}$, and a thickness of 200 nm. In addition, third nitride semiconductor layer 170 has a length of 500 μm (length in a direction perpendicular to a sheet surface in FIG. 8), and a width of 2 μm (width in a direction along the sheet surface in FIG. 8).

A metal electrode may be additionally provided on n-third nitride semiconductor layer 170, and in this variation example, drain connection electrode 180 is provided and composed of a titanium layer having a thickness of 20 nm and an aluminum layer having a thickness of 200 nm. Drain connection electrode 180 makes an ohmic contact with n-third nitride semiconductor layer 170.

The electrode portion serving as third nitride semiconductor layer 170 is configured such that when a voltage is applied to second electrode 105 with respect to first electrode 112 while a voltage equal to or higher than the gate threshold voltage is applied to gate electrode 110, a potential difference formed between third nitride semiconductor layer 170 and second nitride semiconductor layer 104 just under third nitride semiconductor layer 170 becomes equal to or greater than an energy barrier formed between third nitride semiconductor layer 170 and second nitride semiconductor layer 104, and a current flows from third nitride semiconductor layer 170 to first electrode 112. At this time, the trapped electrons are absorbed by third nitride semiconductor layer 170, so that the current collapse can be effectively prevented.

Furthermore, third nitride semiconductor layer 170 may be made of $Al_xGa_{1-x}N$ ($0<x\leq1$) or $In_yAl_zGa_{1-y-z}N$ ($0\leq y\leq1$, $0\leq z\leq1$) instead of GaN.

Furthermore, the Si impurity concentration may be about $1\times10^{14}$ cm$^{-3}$ to $1\times10^{16}$ cm$^{-3}$ so that third nitride semiconductor layer 170 can make a Schottky contact with second nitride semiconductor layer 104. Third nitride semiconductor layer 170 may have a width of 1 μm to 3 μm, depending on a distance between second electrode 105 and gate electrode 110.

Variation 4

Figure 9:
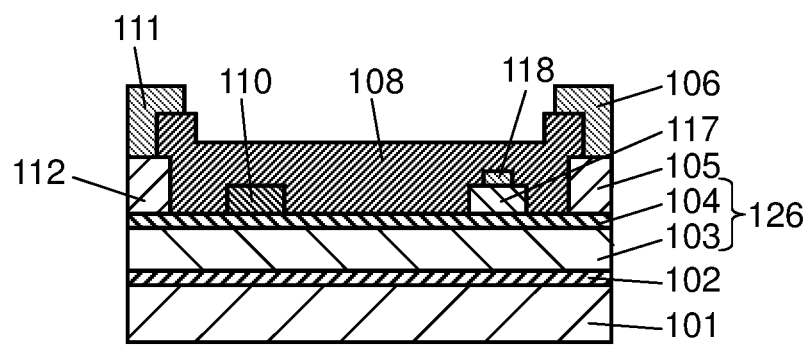
FIG. 9 is a cross-sectional view showing a semiconductor device according to Variation 4 of the first exemplary embodiment of the present disclosure.

FIG. 9 is a cross-sectional view of an FET in Variation 4 of this exemplary embodiment.

This FET differs from the FET shown in FIG. 1 in that p-organic semiconductor layer 117 is formed instead of electrode portion 107 serving as the Schottky electrode. Other configurations including the finger structure are the same as those of the FET shown in the first exemplary embodiment (refer to FIGS. 1, 2, 3A, and 3B, and Table 1).

When p-organic semiconductor layer 117 is provided, and holes are injected from p-organic semiconductor layer 117, the holes can be recombined with electrons trapped in semiconductor layer stacked body 126 under organic semiconductor layer 117.

Organic semiconductor layer 117 is made of acene including pentacene derivative, tethracene derivative, or anthracene derivative, perylene, rubrene, phthalocyanine, or Zn phthalocyanine, and more favorably made of tethracene or Zn phthalocyanine. Organic semiconductor layer 117 is favorably formed by a method such as vapor deposition, sputtering, spin-on, or sol-gel, and more favorably formed by a method such as resistance heating vapor deposition or spin-on. A thickness is about several 10 nm to 100 nm.

A metal electrode may be additionally provided on p-organic semiconductor layer 117, and in this variation example, drain connection electrode 118 is provided as a stacked electrode made of titanium (Ti) and aluminum (Al) and connected to organic semiconductor layer 117.

Furthermore, organic semiconductor layer 117 has the p-conductivity in the above description, but it may not have the p-conductivity.

Variation 5

Figure 10:
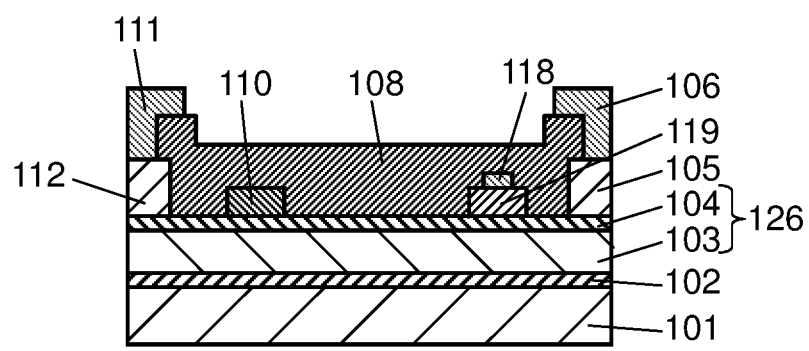
FIG. 10 is a cross-sectional view showing a semiconductor device according to Variation 5 of the first exemplary embodiment of the present disclosure.

FIG. 10 is a cross-sectional view of an FET in Variation 5 of this exemplary embodiment.

This FET differs from the FET shown in FIG. 1 in that p-oxide semiconductor layer 119 is formed instead of electrode portion 107 serving as the Schottky electrode. Other configurations including the finger structure are the same as those of the FET shown in the first exemplary embodiment (refer to FIGS. 1, 2, 3A, and 3B, and Table 1).

When the electrode portion is provided as p-oxide semiconductor layer 119, and holes are injected from p-oxide semiconductor layer 119, the holes can be recombined with electrons trapped in semiconductor layer stacked body 126 under oxide semiconductor layer 119.

Oxide semiconductor layer 119 is composed of a nickel oxide (NiO) layer formed by electron beam vapor deposition and oxidizing nickel (Ni). Oxide semiconductor layer 119 has a thickness of several 10 nm to 100 nm. Oxide semiconductor layer 119 may be a p-oxide semiconductor made of iron oxide ($FeO_2$), cobalt oxide ($CoO_2$), manganese oxide (MnO), or copper oxide (CuO) other than nickel oxide (NiO).

A metal electrode may be additionally provided on p-oxide semiconductor layer 119, and in this variation example, drain connection electrode 118 is provided as a stacked electrode made of titanium (Ti) and aluminum (Al) and in contact with p-oxide semiconductor layer 119. Furthermore, oxide semiconductor layer 119 has the p-conductivity in the above description, but it may not have the p-conductivity.

Variation 6

Figure 11:
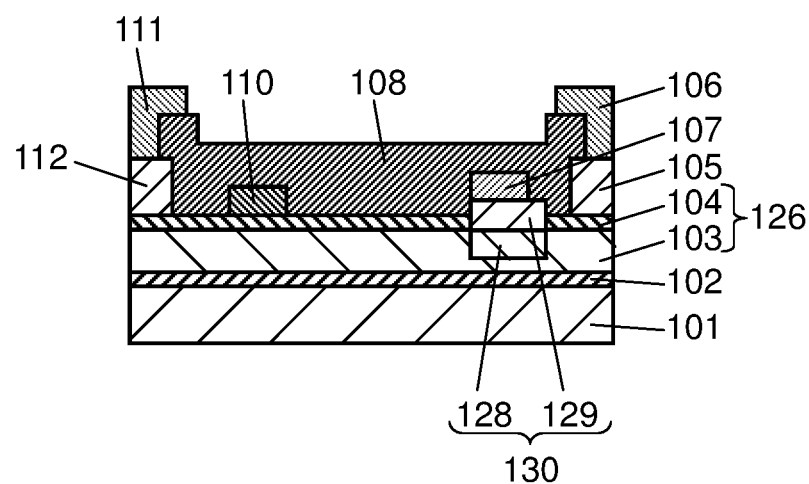
FIG. 11 is a cross-sectional view showing a semiconductor device according to Variation 6 of the first exemplary embodiment of the present disclosure.

FIG. 11 is a cross-sectional view of an FET in Variation 6 of this exemplary embodiment.

This FET differs from the FET shown in FIG. 1 in that high carrier concentration semiconductor layer 130 is provided just under electrode portion 107. High carrier concentration semiconductor layer 130 has a sheet carrier concentration higher than semiconductor layer stacked body 126, and second nitride semiconductor layer 129 is thicker than second nitride semiconductor layer 104 in semiconductor layer stacked body 126. Other configurations including the finger structure are the same as those of the FET shown in the first exemplary embodiment (refer to FIGS. 1, 2, 3A, and 3B, and Table 1).

A configuration of high carrier concentration semiconductor layer 130 will be described in detail.

High carrier concentration semiconductor layer 130 has a hetero junction structure composed of first nitride semiconductor layer 128 and second nitride semiconductor layer 129. A composition of first nitride semiconductor layer 128 is the same as a composition of first nitride semiconductor layer 103, and a composition of second nitride semiconductor layer 129 is the same as a composition of second nitride semiconductor layer 104.

High carrier concentration semiconductor layer 130 has an n-conductivity, and has a sheet carrier concentration of $1.3 \times 10^{13}$ cm$^{-2}$ which is higher than a sheet carrier concentration of semiconductor layer stacked body 126. In addition, second nitride semiconductor layer 129 has a thickness of 60 nm, and second nitride semiconductor layer 104 has a thickness of 40 nm.

Furthermore, high carrier concentration semiconductor layer 130 has a length of 500 μm (length in a direction perpendicular to a sheet surface in FIG. 11), and a width of 3 μm (width in a direction along the sheet surface in FIG. 11) which is a little larger than that of electrode portion 107.

With this configuration, high carrier concentration semiconductor layer 130 can be increased in sheet carrier concentration. In addition, when a reverse bias is applied to second electrode 105, an electron current in the 2DEG layer is hardly affected by a depletion layer spreading under electrode portion 107, so that a large reverse current can flow from first electrode 112 to second electrode 105.

In addition, when an n-impurity concentration of first nitride semiconductor layer 128 is set higher than that of first nitride semiconductor layer 103 in semiconductor layer stacked body 126, the sheet carrier concentration can be high, which is more favorable.

Furthermore, first nitride semiconductor layer 128 and first nitride semiconductor layer 103 may be different in composition, or may have the same thickness.

Variation 7

Figure 12:
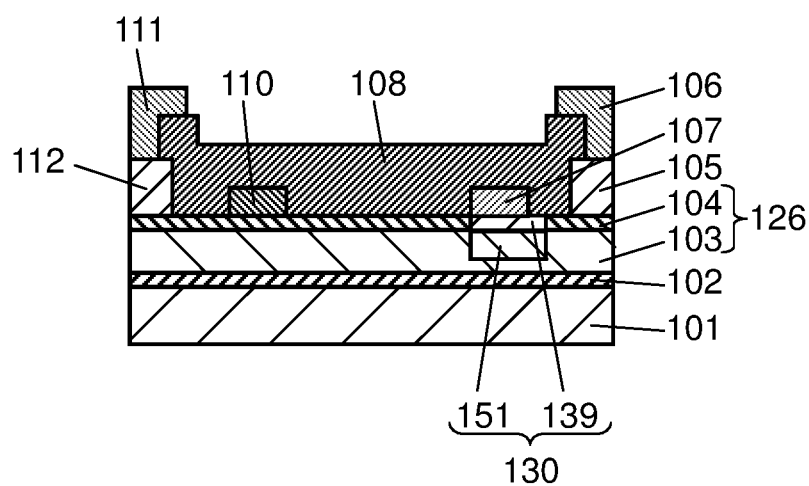
FIG. 12 is a cross-sectional view showing a semiconductor device according to Variation 7 of the first exemplary embodiment of the present disclosure.

FIG. 12 is a cross-sectional view of a FET in Variation 7 of this exemplary embodiment.

This FET differs from the FET in Variation 6 shown in FIG. 11 in that second nitride semiconductor layer 139 in high carrier concentration semiconductor layer 130 just under electrode portion 107 has a bandgap wider than second nitride semiconductor layer 104 in semiconductor layer stacked body 126. Other configurations including the finger structure are the same as those of the FET shown in the first exemplary embodiment (refer to FIGS. 1, 2, 3A, and 3B, and Table 1).

A configuration of high carrier concentration semiconductor layer 130 will be described in detail.

High carrier concentration semiconductor layer 130 has a hetero junction structure composed of first nitride semiconductor layer 151 and second nitride semiconductor layer 139. A composition of first nitride semiconductor layer 151 is the same as a composition of first nitride semiconductor layer 103.

Second nitride semiconductor layer 139 has an Al composition ratio of 20% and a bandgap of 3.98 eV (while second nitride semiconductor layer 104 has an Al composition ratio of 17% and a bandgap of 3.89 eV).

High carrier concentration semiconductor layer 130 has an n-conductivity, and has a sheet carrier concentration of $1.3 \times 10^{13}$ cm$^{-2}$ which is higher than a sheet carrier concentration of semiconductor layer stacked body 126. In addition, second nitride semiconductor layer 139 has a thickness of 40 nm.

Furthermore, high carrier concentration semiconductor layer 130 has a length of 500 μm (length in a direction perpendicular to a sheet surface in FIG. 12), and a width of 3 μm (width in a direction along the sheet surface in FIG. 12) which is a little larger than electrode portion 107.

With this configuration, high carrier concentration semiconductor layer 130 can be increased in sheet carrier concentration, so that when a reverse bias is applied to second electrode 105, a large reverse current can flow from first electrode 112 to second electrode 105.

In addition, when an n-impurity concentration of first nitride semiconductor layer 151 is set higher than that of first nitride semiconductor layer 103 in semiconductor layer stacked body 126, the sheet carrier concentration can be high, which is more favorable.

Furthermore, first nitride semiconductor layer 151 and first nitride semiconductor layer 103 may be different in composition, or may have the same thickness.

Variation 8

Figure 13A:
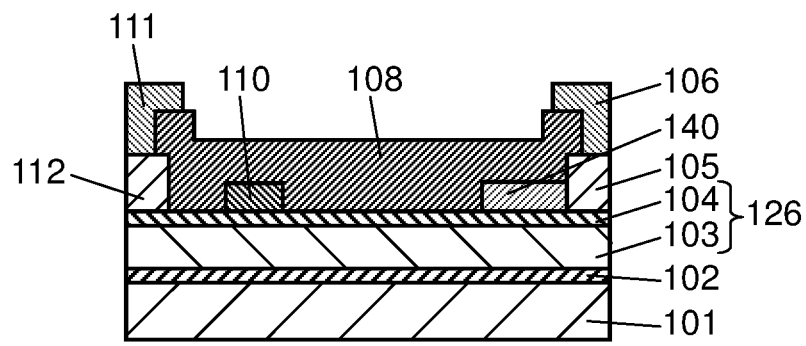
FIG. 13A is a cross-sectional view showing a semiconductor device according to Variation 8 of the first exemplary embodiment of the present disclosure.

FIG. 13A is a cross-sectional view of an FET in Variation 8 of this exemplary embodiment.

This FET differs from the FET shown in FIG. 1 in that a side surface of electrode portion 140 is in contact with second electrode 105. Other configurations including the finger structure are the same as those of the FET shown in the Variation 8 (refer to FIGS. 1, 2, 3A, and 3B, FIG. 13A, and Table 1).

In this variation example, a cell pitch of a field effect transistor can be reduced, so that a chip size can be miniaturized.

Variation 9

Figure 13B:
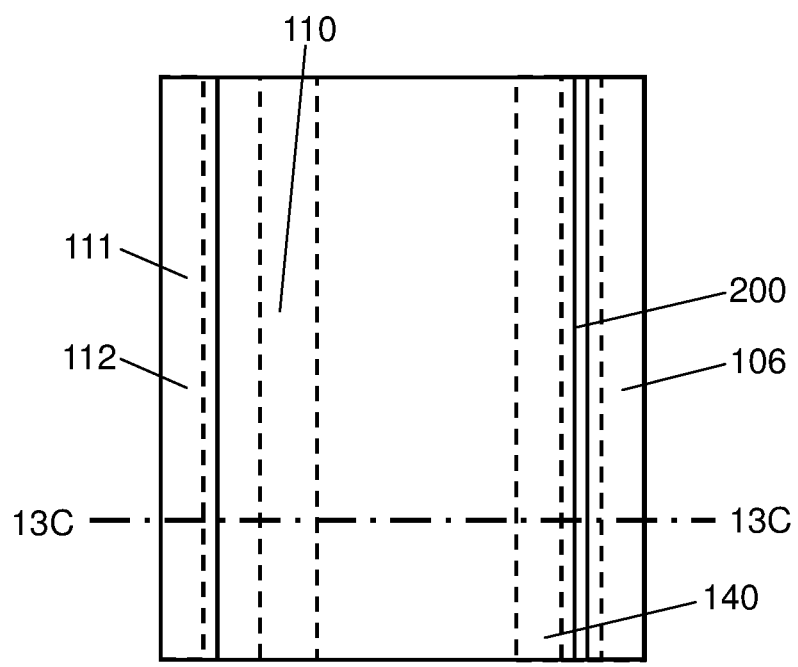
FIG. 13B is a perspective view showing a semiconductor device taken from above according to Variation 9 of the first exemplary embodiment of the present disclosure.
Figure 13C:
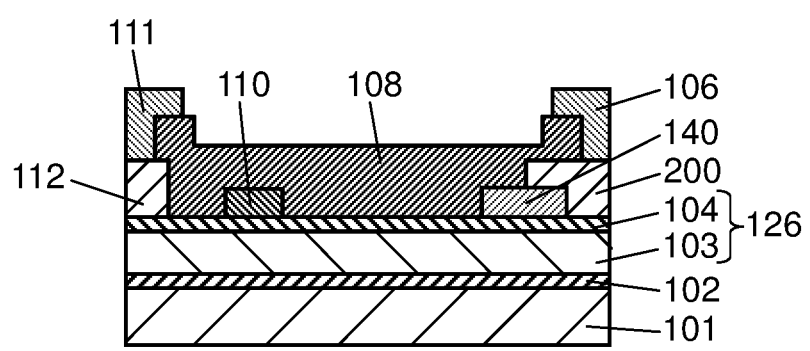
FIG. 13C is a cross-sectional view showing the semiconductor device according to Variation 9 of the first exemplary embodiment of the present disclosure.

FIG. 13B is a plan view of an FET in Variation 9 of this exemplary embodiment taken from above. FIG. 13C is a cross-sectional view of the FET in Variation 9 of this exemplary embodiment and shows a cross-sectional surface taken along line 13C-13C in FIG. 13B.

This FET differs from the FET in Variation 8 shown in FIG. 13A in that second electrode 200 hangs over electrode portion 140. In addition, electrode portion 140 forms a Schottky junction with second electrode 200. Other configurations including the finger structure are the same as those of the FET shown in the first exemplary embodiment (refer to FIGS. 1, 2, 3A, and 3B, and Table 1).

In the above variation example, second electrode 200 can be made of a general material such as Ti/Al. Furthermore, second electrode 200 can serve as a wiring line of electrode portion 140. In this case, a process can be simplified and cost can be low, compared with a case where the wiring line of electrode portion 140 and second electrode 200 are separately formed.

In addition, while second electrode 200 hangs over electrode portion 140, but in this case, an end of second electrode 200 is favorably formed so as not to exceed an end of electrode portion 140 on a side closer to a gate electrode. This is because when an end of second electrode 200 goes beyond electrode portion 140, a potential difference is not likely to be formed between electrode portion 140 and second nitride semiconductor layer 104 just under electrode portion 140, and the potential difference does not become equal to or higher than an energy barrier even when the drain voltage is increased, so that the current collapse is not effectively prevented.

Variation 10

Figure 13D:
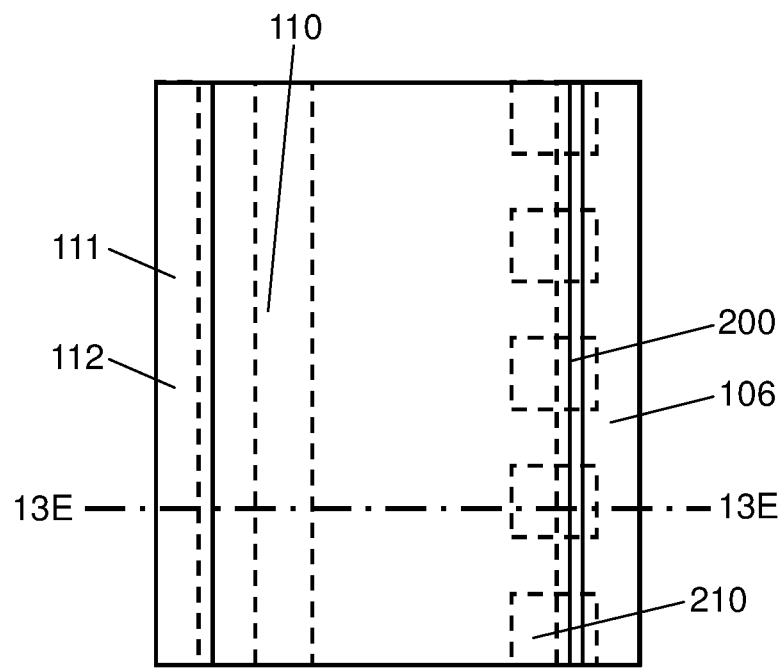
FIG. 13D is a perspective view showing a semiconductor device taken from above according to Variation 10 of the first exemplary embodiment of the present disclosure.
Figure 13E:
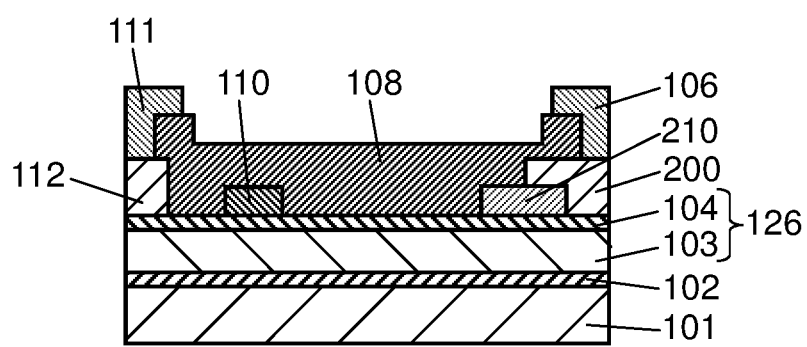
FIG. 13E is a cross-sectional view showing the semiconductor device according to Variation 10 of the first exemplary embodiment of the present disclosure.

FIG. 13D is a plan view of an FET in Variation 10 of this exemplary embodiment taken from above. FIG. 13E is a cross-sectional view of the FET in Variation 10 in this exemplary embodiment and shows a cross-sectional surface taken along line 13E-13E in FIG. 13D.

This FET differs from the FET in Variation 9 shown in FIGS. 13B and 13C in that a plurality of island-shaped electrode portions 210 are separately formed so as to be spaced from each other when viewed from above. In addition, each of electrode portions 210 forms Schottky junction with second electrode 200. Other configurations are the same as those of the FET shown in Variation 9.

In this variation example, since island-shaped electrode portions 210 are formed, a current flowing between first electrode 112 and second electrode 200 also flows in a channel other than a channel under electrode portion 210. As a result, when a forward bias is applied to second electrode 200, a current flows around a depletion layer spreading under electrode portion 210, so that a larger current can flow into first electrode 112.

In addition, in the case where the current flowing between first electrode 112 and second electrode 200 flows in the channel other than the channel just under electrode portion 210, when a reverse bias is applied to second electrode 200, a larger current can flow into second electrode 200.

Variation 11

Figure 13F:
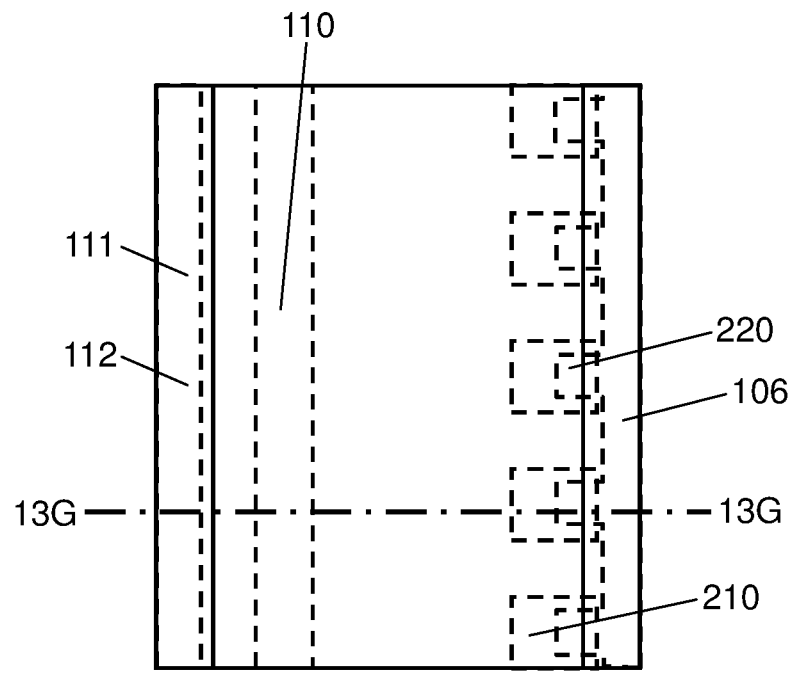
FIG. 13F is a perspective view showing a semiconductor device taken from above according to Variation 11 of the first exemplary embodiment of the present disclosure.
Figure 13G:
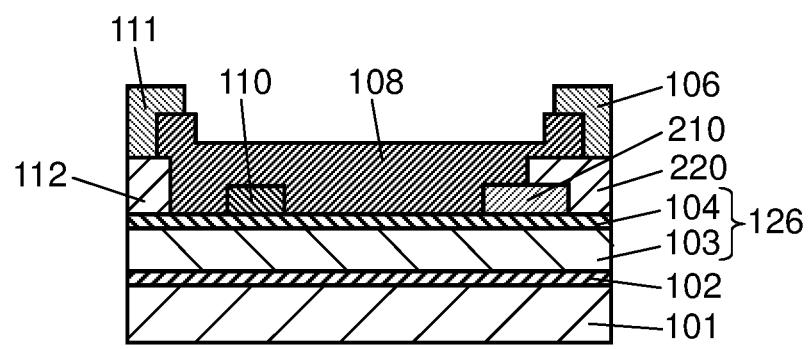
FIG. 13G is a cross-sectional view showing the semiconductor device according to Variation 11 of the first exemplary embodiment of the present disclosure.

FIG. 13F is a plan view of an FET in Variation 11 of this exemplary embodiment take from above. FIG. 13G is a cross-sectional view of the FET in Variation 11 in this exemplary embodiment and shows a cross-sectional surface taken along line 13G-13G in FIG. 13F.

This FET differs from the FET in Variation 10 shown in FIGS. 13D and 13E in that along with plurality of island-shaped electrode portions 210, second electrode 220 is formed into a comb shape when viewed from above.

Furthermore, second electrode 220 forms a Schottky junction with electrode portion 210. Other configurations are the same as those of the FET shown in Variation 10.

In the above variation example, since second electrode 220 is formed into the comb shape, second electrode 220 is not provided between adjacent island-shaped electrode portions 210 unlike Variation 10. Therefore, the current collapse can be more effectively prevented with second electrode 220 than Variation 10.

According to this exemplary embodiment, first electrode 112 and second electrode 105 are formed on semiconductor layer stacked body 126, but they may be formed on silicon substrate 101 as long as they are in contact with semiconductor layer stacked body 126. For example, as another configuration, a via hole is formed so as to penetrate second nitride semiconductor layer 104 from silicon substrate 101, a metal layer is formed on a rear surface of silicon substrate 101 and in the via hole, and this metal layer is connected to an electrode formed on a front surface of second nitride semiconductor layer 104.

Second Exemplary Embodiment

Figure 14:
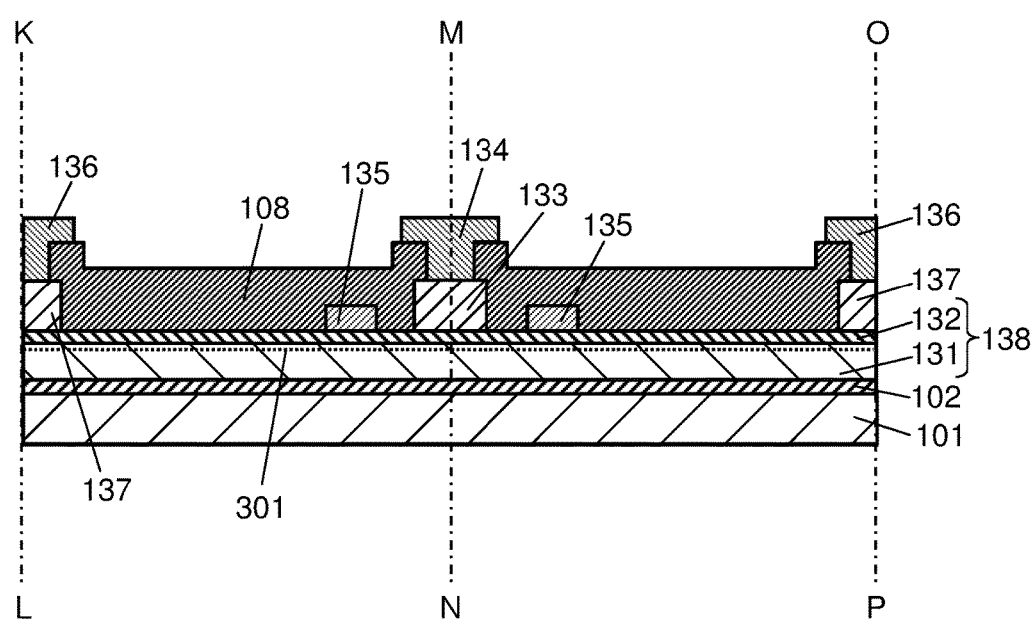
FIG. 14 is a cross-sectional view showing a semiconductor device according to a second exemplary embodiment of the present disclosure.

FIG. 14 is a cross-sectional view of a semiconductor device according to the second exemplary embodiment of the present disclosure. In addition, this semiconductor device is a diode.

FIG. 14 is the cross-sectional view of the diode serving as the semiconductor device in Example 1 of the second exemplary embodiment.

The semiconductor device shown in FIG. 14 includes silicon substrate 101 having a plane orientation of (111) on a main surface, and a thickness of 350 μm, and semiconductor layer stacked body 138 formed on silicon substrate 101 and composed of first nitride semiconductor layer 131, and second nitride semiconductor layer 132 having a bandgap wider than first nitride semiconductor layer 131, with buffer layer 102 interposed between semiconductor layer stacked body 138 and silicon substrate 101. First nitride semiconductor layer 131 has two-dimensional electron gas channel 301 in a vicinity of an interface with second nitride semiconductor layer 132. In addition, first electrode 137 serving as an anode electrode, and second electrode 133 serving as a cathode electrode are formed on semiconductor layer stacked body 138 so as to be spaced from each other. Electrode portion 135 is formed on semiconductor layer stacked body 138 so as to be disposed between first electrode 137 and second electrode 133 and positioned closer to second electrode 133 than first electrode 137. Furthermore, interlayer insulating film 108 is formed on semiconductor layer stacked body 138, first electrode 137, second electrode 133, and electrode portion 135. An opening is formed in interlayer insulating film 108 so as to correspond to a position of first electrode 137, and first electrode wiring line 136 is formed in this opening. Furthermore, an opening is formed in interlayer insulating film 108 so as to correspond to a position of second electrode 133, and second electrode wiring line 134 is formed in this opening. Furthermore, semiconductor layer stacked body 138 is formed by metalorganic vapor phase epitaxy (MOVPE), and a main surface of the semiconductor layer in semiconductor layer stacked body 138 has a plane orientation of (0001).

Here, buffer layer 102 has a multilayer structure composed of an AlN layer and an AlGaN layer formed on silicon substrate 101. Buffer layer 102 has a total thickness of about 2.1 μm.

First nitride semiconductor layer 131 is a channel layer formed for electron transition, composed of undoped GaN, and has a thickness of 1.6 μm. Here, "undoped" means that an impurity is not introduced intentionally.

Second nitride semiconductor layer 132 is an electron supply layer, composed of undoped $Al_{0.17}Ga_{0.83}N$, and has a thickness of 60 nm.

Two-dimensional electron gas channel 301 is formed in an interface between first nitride semiconductor layer 131 and second nitride semiconductor layer 132.

Second electrode 133 has a configuration in which an aluminum layer having a thickness of 200 nm is formed on a titanium layer having a thickness of 20 nm formed on second nitride semiconductor layer 132 (so-called Ti/Al configuration).

First electrode 137 has a configuration in which a gold layer having a thickness of 200 nm is formed on a nickel layer having a thickness of 100 nm formed on second nitride semiconductor layer 132 (so-called Ni/Au configuration). First electrode 137 forms a Schottky contact with second nitride semiconductor layer 132.

Electrode portion 135 is made of a metal which forms a Schottky junction with second nitride semiconductor layer 132. Here, a gold layer having a thickness of 20 nm is formed on a nickel layer having a thickness of 100 nm formed on second nitride semiconductor layer 132.

In addition, electrode portion 135 is composed of a metal stacked body made of nickel (Ni) and gold (Au), or a rhodium (Rh) layer, and formed on second nitride semiconductor layer 132 so that the energy barrier is formed, that is, a Schottky junction is provided with second nitride semiconductor layer 132. Second electrode 133 serving as the cathode electrode is connected to electrode portion 135 at a position not shown in FIG. 14.

Interlayer insulating film 108 is composed of a silicon nitride film (SiN film) having a thickness of 1 μm. Interlayer insulating film 108 is formed by a chemical vapor deposition (CVD) method, for example.

Each of first electrode wiring line 136 and second electrode wiring line 134 is made of copper and having a thickness of 6 μm. When second electrode wiring line 134 is provided, resistance can be reduced in second electrode 133 serving as the cathode electrode and a wiring line connected to second electrode 133.

In addition, each of first electrode 137, second electrode 133, and electrode portion 135 has a finger structure (not shown), and one finger of the electrode has a length of 500 μm (a length perpendicular to a sheet surface in FIG. 14). In addition, first electrode 137 has a width of 5 μm (width included in the plane orientation of (0001) and along the sheet surface in FIG. 14), and second electrode 133 has a width of 10 μm. In addition, electrode portion 135 has a width of 2 μm.

A distance between first electrode 137 and second electrode 133 (a distance between opposed electrode ends) is 20 μm. Electrode portion 135 is provided 12 μm away from an end, which faces electrode portion 135, of first electrode 137.

The semiconductor device shown in FIG. 14 has a configuration in which electrode portions 135 and first electrodes 137 are symmetrically disposed with respect to second electrode 133. That is, as for an electrode arrangement in FIG. 14, first electrode 137, electrode portion 135, second electrode 133, electrode portion 135, and first electrode 137 are sequentially formed from a left side. In addition, the semiconductor device also has a configuration in which electrode portions 135, and second electrodes 133 are symmetrically disposed with respect to first electrode 137. In FIG. 14, with respect to each of line K-L, line M-N, and line O-P, the electrodes are disposed in a linearly symmetrical manner.

In addition, as for a whole semiconductor device (one chip), an electrode length (total length) of first electrode 137, second electrode 133, and electrode portion 135 is 20 μm.

The configuration of the semiconductor device is listed in Table 2.

TABLE 2

| | Material or composition | Conductivity type | Thickness |
|---|---|---|---|
| Silicon substrate 101 | Si | — | 350 μm |
| Buffer layer 102 | Stacked structure of AlN and AlGaN | Undoped | Total thickness of 2.1 μm |
| First nitride semiconductor layer 131 | GaN | Undoped | 1.6 μm |
| Second nitride semiconductor layer 132 | $Al_{0.18}Ga_{0.82}N$ | Undoped | 60 nm |

| | Material or composition | Thickness | Electrode width | Electrode length (finger length) |
|---|---|---|---|---|
| First electrode 137 | Ti/Al | Ti: 20 nm, Al: 200 nm | 5 μm | 500 μm |

TABLE 2-continued

| | Material or composition | Conductivity type | Thickness | |
|---|---|---|---|---|
| Second electrode 133 | Ni/Au | Ni:100 nm, Au: 200 nm | 1 μm | 500 μm |
| Electrode portion 107 | Ni/Au | Ni:100 nm, Au: 200 nm | 2 μm | 500 μm |

| | Material or composition | Thickness |
|---|---|---|
| First electrode wiring 136 | Cu | 6 μm |
| Second electrode wiring 134 | Cu | 6 μm |

| | Material or composition | Thickness |
|---|---|---|
| Interlayer insulating film 109 | SiN | 1 μm |

Next, an operation of the diode in this exemplary embodiment will be described.

This diode is configured such that when a positive bias is applied to first electrode 137 serving as the anode electrode with respect to second electrode 133 serving as the cathode electrode, a current flows from first electrode 137 serving as the anode electrode to second electrode 133 serving as the cathode electrode through two-dimensional electron gas channel 301 formed in a vicinity of an interface between first nitride semiconductor layer 131 and second nitride semiconductor layer 132 (on state).

Meanwhile, when a positive bias is applied to second electrode 133 serving as the cathode electrode with respect to first electrode 137 serving as the anode electrode, a current does not flow (off state).

At the time of transition from the on-state to the off-state of the diode, an electron current flows in an intense electric field region in a vicinity of second electrode 133 serving as the cathode electrode only for a moment. Consequently, due to the intense electric field, electrons are trapped in a defect in second nitride semiconductor layer 132 or an interface state generated between interlayer insulating film 108 and second nitride semiconductor layer 132.

According to a conventional diode, if the switching operation is continued with electrons 123 being kept trapped, scattering is caused in the channel because trapped electrons 123 are negatively charged, so that electron mobility is lowered, and on-resistance is increased. In addition, an electric field concentration occurs due to trapped electrons 123, so that an insulation breakdown occurs, that is, so-called current collapse occurs.

Meanwhile, the diode of the present disclosure includes electrode portion 135 composed of a Schottky electrode. Therefore, trapped electrons are mostly absorbed by electrode portion 135 and not left in second nitride semiconductor layer 132, so that the current collapse which is the problem in the conventional diode does not occur.

Figure 15A:
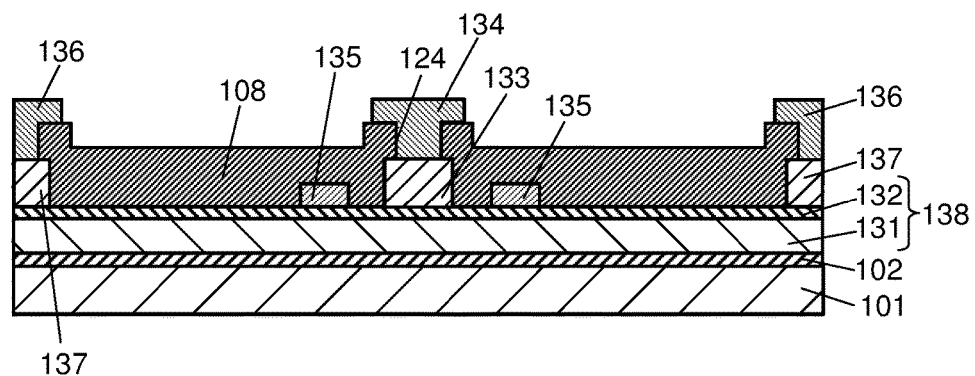
FIG. 15A is a cross-sectional view showing the semiconductor device according to the second exemplary embodiment of the present disclosure.
Figure 15B:
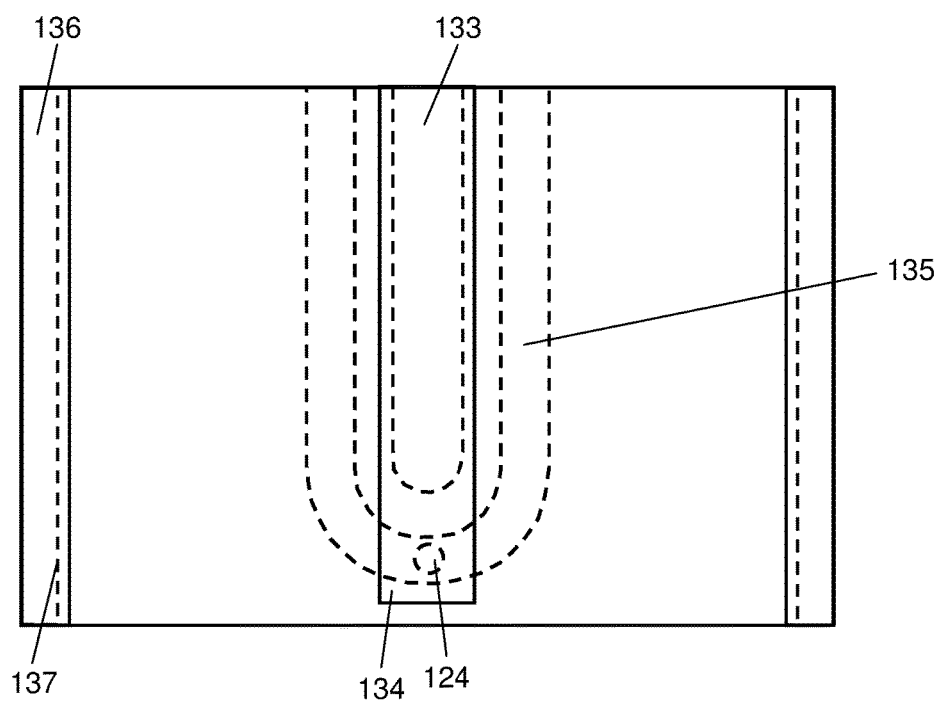
FIG. 15B is a perspective view showing the semiconductor device taken from above according to the second exemplary embodiment of the present disclosure.

FIGS. 15A and 15B are a cross-sectional view and a plan view of the diode in this exemplary embodiment, respectively. In addition, FIG. 15A is the same as FIG. 14.

Second electrode 133 serving as the cathode electrode is surrounded by electrode portion 135, and via hole 124 is formed at an intersection of second electrode wiring line 134 and electrode portion 135, in interlayer insulating film 108 so that second electrode wiring line 134 is connected to electrode portion 135.

With this configuration, since second electrode 133 serving as the cathode electrode is surrounded by electrode portion 135, electrode portion 135 can be inevitably disposed in a channel of a current flowing from first electrode 137 serving as the anode electrode to second electrode 133 serving as the cathode electrode, so that the current collapse can be surely prevented.

In addition, compared with a case where an opening is formed in a whole region of the electrode portion to be used for connection to second electrode wiring line 134, it is not necessary to form the opening in electrode portion 135, so that electrode portion 135 can be narrowed.

Furthermore, second electrode wiring line 134 favorably has a projecting length which remains inside electrode portion 135 with respect to a direction toward first electrode 137 serving as the anode electrode. When second electrode wiring line 134 projects beyond electrode portion 135, a potential difference does not become equal to or higher than the energy barrier even when a cathode voltage is increased, so that the trapped electrons cannot be absorbed by electrode portion 135.

This is considered due to the fact that when second electrode wiring line 134 projects beyond electrode portion 135, a potential difference is not likely to be formed between electrode portion 135 and second nitride semiconductor layer 132 just under the electrode portion.

As for the structure composed of electrode portion 135 and semiconductor layer stacked body 138 provided underneath, even when a maximum operating voltage is applied to between first electrode 137 serving as the anode electrode and second electrode 133 serving as the cathode electrode with first electrode 137 set positive, a conductive state is provided in two-dimensional electron gas channel 301 under electrode portion 135.

With this configuration, the channel does not become a pinch-off state under electrode portion 135, so that the conductive state is provided from first electrode 137 serving as the anode electrode, to second electrode 133 serving as the cathode electrode.

Variation 1

Figure 16A:
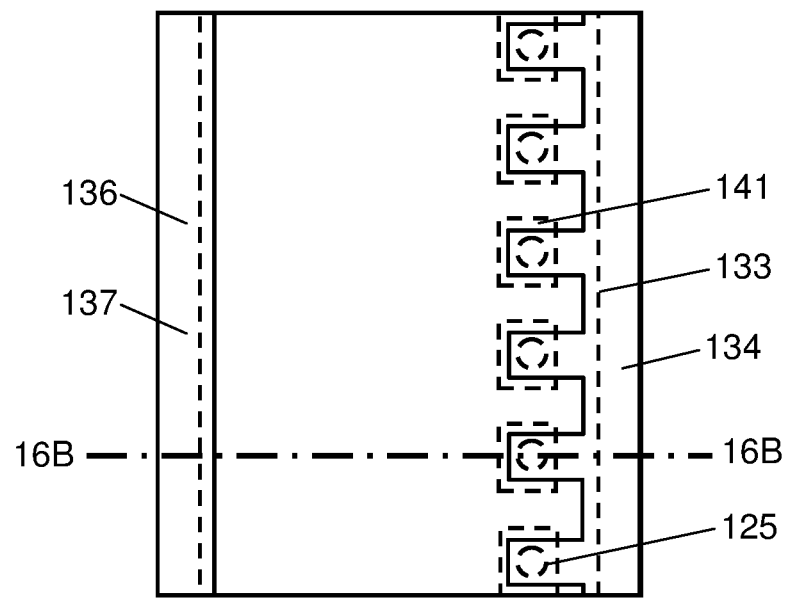
FIG. 16A is a perspective view showing a semiconductor device taken from above according to Variation 1 of the second exemplary embodiment of the present disclosure.
Figure 16B:
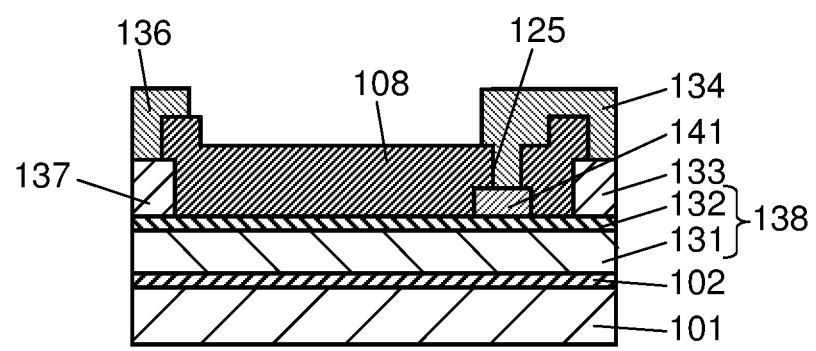
FIG. 16B is a cross-sectional view showing the semiconductor device according to Variation 1 of the second exemplary embodiment of the present disclosure.

FIGS. 16A and 16B are a plan view and a cross-sectional view taken along line 16B-16B in FIG. 16A, respectively, and each show a diode in Variation 1 of this exemplary embodiment.

In addition, FIGS. 16A and 16B are the plan view and the cross-sectional view, respectively and each show a unit cell corresponding to the part from line K-L to line M-N in the semiconductor device in FIG. 14. As for an actual diode, the unit cell in FIGS. 16A and 16B which corresponds to the part from line K-L to line M-N in FIG. 14 is repeatedly disposed in a linearly symmetrical manner.

This semiconductor device differs from the diode shown in FIGS. 15A and 15B in that plurality of island-shaped electrode portions 141 are separately formed so as to be spaced from each other.

Via holes 125 are formed in interlayer insulating film 108 so as to be positioned above island-shaped electrode portions 141, and second electrode wiring line 134 is formed to stride over island-shaped electrode portions 141 so that second electrode wiring line 134 is connected to electrode portions 141 through island-shaped via holes 125.

In this case, since island-shaped electrode portions 141 are formed, a current flowing between first electrode 137 serving as the anode electrode and second electrode 133 serving as the cathode electrode also flows in a channel other than a channel under electrode portion 141, compared with the configuration shown in FIGS. 15A and 15B. As a result, when a reverse bias is applied to second electrode 133 serving as the cathode electrode, a current flows so as to detour a depletion layer spreading under electrode portion 141, so that a larger current can flow into second electrode 133 serving as the cathode electrode.

Variation 2

Figure 17:
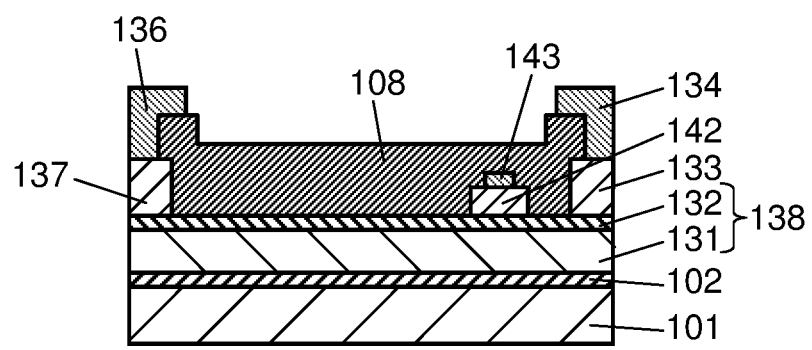
FIG. 17 is a cross-sectional view showing a semiconductor device according to Variation 2 of the second exemplary embodiment of the present disclosure.

FIG. 17 shows a cross-sectional view of a diode in Variation 2 of this exemplary embodiment.

This diode differs from the diode shown in FIG. 14 in that p-third nitride semiconductor layer 142 is formed instead of electrode portion 135 serving as the Schottky electrode. Other configurations including the finger structure are the same as those of the diode shown in the second exemplary embodiment (refer to FIGS. 14, 15A, and 15B, and Table 2).

When the electrode portion is provided as p-third nitride semiconductor layer 142, and holes are injected from p-third nitride semiconductor layer 142, the holes can be recombined with electrons trapped in semiconductor layer stacked body 138 under p-third nitride semiconductor layer 142.

Furthermore, third nitride semiconductor layer 142 may be composed of a GaN layer, and has a thickness of about 50 nm to 300 nm. A p-impurity doped into third nitride semiconductor layer 142 may be magnesium (Mg), and a concentration of Mg may be about $1\times10^{18}$ cm$^{-3}$ to $1\times10^{21}$ cm$^{-3}$. Third nitride semiconductor layer 142 may have a width of 1 μm to 3 μm, depending on a distance between second electrode 133 serving as the cathode electrode and first electrode 137 serving as the anode electrode.

A metal electrode may be additionally provided on p-third nitride semiconductor layer 142, and in this variation example, cathode connection electrode 143 made of palladium (Pd) is provided and connected to third nitride semiconductor layer 142 by ohmic contact.

Cathode connection electrode 143 does not necessarily form the ohmic contact, and a current collapse can be effectively prevented even in a case where it is a metal stacked body composed of titanium (Ti) and aluminum (Al), and forms a Schottky junction with p-third nitride semiconductor layer 142.

Furthermore, third nitride semiconductor layer 142 has the p-conductivity in the above description, but it may have an n-conductivity instead of the p-conductivity. In the case of having the n-conductivity, the trapped electrons are absorbed by third nitride semiconductor layer 142, and the current collapse can be effectively prevented, similar to Example 1 provided with electrode portion 135 in FIG. 14.

Variation 3

Figure 18:
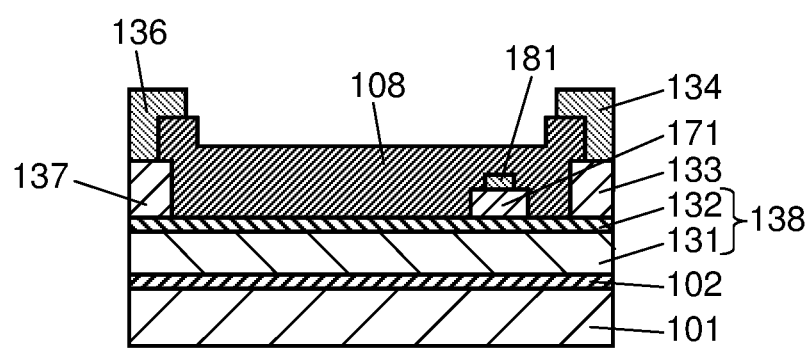
FIG. 18 is a cross-sectional view showing a semiconductor device according to Variation 3 of the second exemplary embodiment of the present disclosure.

FIG. 18 is a cross-sectional view of a diode in Variation 3 of this exemplary embodiment.

This diode differs from the diode shown in FIG. 14 in that n-third nitride semiconductor layer 171 is formed instead of electrode portion 135 serving as the Schottky electrode. Other configurations including the finger structure are the same as those of the diode shown in the second exemplary embodiment (refer to FIGS. 14, 15A, and 15B, and Table 2).

Furthermore, n-third nitride semiconductor layer 171 is composed of Si-doped n-GaN layer having a Si impurity concentration of $1\times10^{15}$ cm$^{-3}$, and a thickness of 200 nm. In addition, third nitride semiconductor layer 171 has a length of 500 μm (length in a direction perpendicular to a sheet surface in FIG. 18) and a width of 2 μm (width in a direction along the sheet surface in FIG. 18).

A metal electrode may be additionally provided on third nitride semiconductor layer 171, and in this variation example, cathode connection electrode 181 is provided and is composed of a titanium layer having a thickness of 20 nm and an aluminum layer having a thickness of 200 nm.

Cathode connection electrode 181 forms an ohmic contact with n-third nitride semiconductor layer 171.

Due to the electrode portion composed of third nitride semiconductor layer 171, the trapped electrons are absorbed by third nitride semiconductor layer 171, so that the current collapse can be effectively prevented.

Furthermore, third nitride semiconductor layer 171 may be made of $Al_xGa_{1-x}N$ (0<x≤1) or $In_yAl_zGa_{1-y-z}N$ (0≤y≤1, 0≤z≤1) instead of GaN. Furthermore, an Si impurity concentration may be as low as about $1\times10^{14}$ cm$^{-3}$ to $1\times10^{16}$ cm$^{-3}$ so that third nitride semiconductor layer 171 can make a Schottky contact with second nitride semiconductor layer 132. Third nitride semiconductor layer 171 may have a width of 1 μm to 3 μm, depending on a distance between second electrode 133 serving as the cathode electrode and first electrode 137 serving as the anode electrode.

Variation 4

Figure 19:
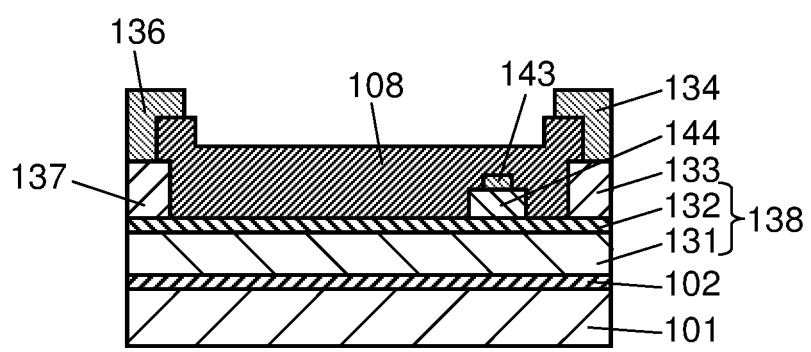
FIG. 19 is a cross-sectional view showing a semiconductor device according to Variation 4 of the second exemplary embodiment of the present disclosure.

FIG. 19 is a cross-sectional view of a diode in Variation 4 of this exemplary embodiment.

This diode differs from the diode shown in FIG. 14 in that p-organic semiconductor layer 144 is formed instead of electrode portion 135 serving as the Schottky electrode. Other configurations including the finger structure are the same as those of the diode shown in the second exemplary embodiment (refer to FIGS. 14, 15A, and 15B, and Table 2).

When the electrode portion is provided as p-organic semiconductor layer 144, and holes are injected from p-organic semiconductor layer 144, the holes can be recombined with electrons trapped in semiconductor layer stacked body 138 under organic semiconductor layer 144.

Organic semiconductor layer 144 is made of acene including pentacene derivative, tethracene derivative, or anthracene derivative, perylene, rubrene, phthalocyanine, or Zn phthalocyanine, and more favorably made of tethracene or Zn phthalocyanine. Organic semiconductor layer 144 is favorably formed by a method such as vapor deposition, sputtering, spin-on, or sol-gel, and more favorably formed by a method such as resistance heating vapor deposition or spin-on. A thickness is about several 10 nm to 100 nm.

A metal electrode may be additionally provided on p-organic semiconductor layer 144, and in this variation example, cathode connection electrode 143 is provided as a stacked electrode made of titanium (Ti) and an aluminum (Al) and connected to p-organic semiconductor layer 144.

Furthermore, organic semiconductor layer 144 has the p-conductivity in the above description, but it may not have the p-conductivity.

Variation 5

Figure 20:
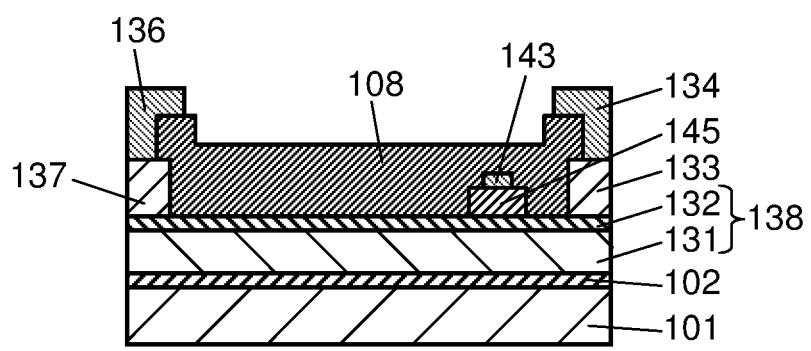
FIG. 20 is a cross-sectional view showing a semiconductor device according to Variation 5 of the second exemplary embodiment of the present disclosure.

FIG. 20 is a cross-sectional view of a diode in Variation 5 of this exemplary embodiment.

This diode differs from the diode shown in FIG. 14 in that p-oxide semiconductor layer 145 is formed instead of electrode portion 135 serving as the Schottky electrode. Other configurations including the finger structure are the same as those of the diode shown in the second exemplary embodiment (refer to FIGS. 14, 15A, and 15B, and Table 2).

When the electrode portion is provided as p-oxide semiconductor layer 145, and holes are injected from p-oxide semiconductor layer 145, the holes can be recombined with electrons trapped in semiconductor layer stacked body 138 under oxide semiconductor layer 145.

Oxide semiconductor layer 145 is composed of a nickel oxide (NiO) layer formed by electron beam vapor deposition and oxidizing nickel (Ni). Oxide semiconductor layer 145 has a thickness of several 10 nm to 100 nm. It may be made of a p-oxide semiconductor such as iron oxide ($FeO_2$), cobalt oxide ($CoO_2$), manganese oxide (MnO), or copper oxide (CuO), in addition to nickel oxide (NiO).

A metal electrode may be additionally provided on p-oxide semiconductor layer 145, and in this variation example, cathode connection electrode 143 is provided as a stacked electrode made of titanium (Ti) and aluminum (Al) and connected to p-oxide semiconductor layer 145. Furthermore, oxide semiconductor layer 145 has the p-conductivity in the above description, but it may not have the p-conductivity.

Variation 6

Figure 21:
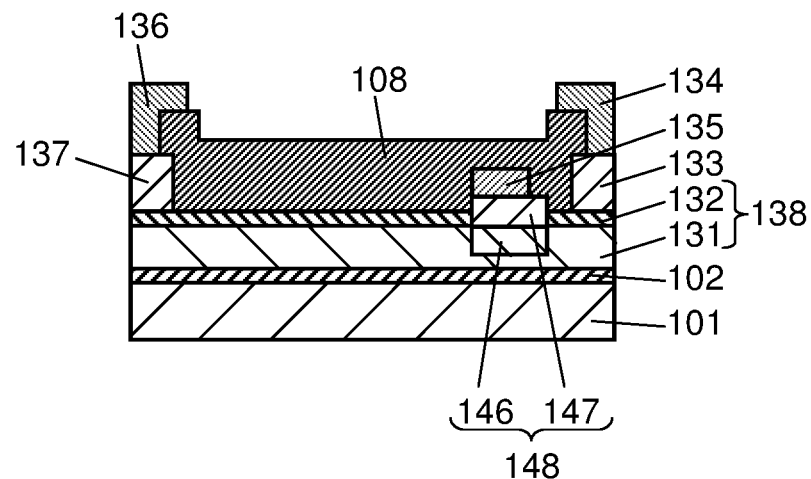
FIG. 21 is a cross-sectional view showing a semiconductor device according to Variation 6 of the second exemplary embodiment of the present disclosure.

FIG. 21 is a cross-sectional view of a diode in Variation 6 of this exemplary embodiment.

This diode differs from the diode shown in FIG. 14 in that high carrier concentration semiconductor layer 148 is provided just under electrode portion 135. Other configurations including the finger structure are the same as those of the diode shown in the second exemplary embodiment (refer to FIGS. 14, 15A, and 15B, and Table 2).

High carrier concentration semiconductor layer 148 has a sheet carrier concentration higher than semiconductor layer stacked body 138, and second nitride semiconductor layer 147 is thicker than second nitride semiconductor layer 132 in semiconductor layer stacked body 138. With this configuration, high carrier concentration semiconductor layer 148 can be increased in sheet carrier concentration. In addition, when a reverse bias is applied to second electrode 133 serving as the cathode electrode, an electron current in the 2DEG layer is hardly affected by the depletion layer spreading under electrode portion 135, so that a large current can flow from first electrode 137 serving as the anode electrode to second electrode 133 serving as the cathode electrode.

In addition, when n-impurity concentration of first nitride semiconductor layer 146 is set higher than that of first nitride semiconductor layer 131 in semiconductor layer stacked body 138, the sheet carrier concentration can be high, which is more favorable. As a matter of course, first nitride semiconductor layer 146 may have the same composition and the same thickness as first nitride semiconductor layer 131 in semiconductor layer stacked body 138.

Variation 7

Figure 22:
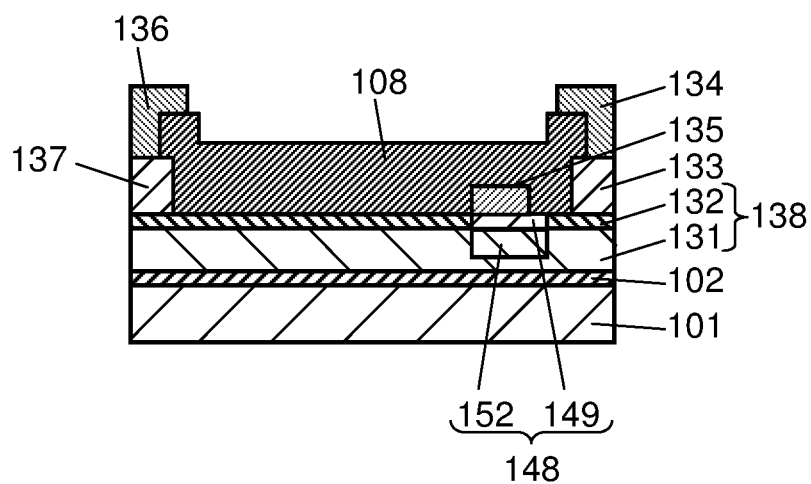
FIG. 22 is a cross-sectional view showing a semiconductor device according to Variation 7 of the second exemplary embodiment of the present disclosure.

FIG. 22 is a cross-sectional view of a diode in Variation 7 of this exemplary embodiment.

This diode differs from the diode shown in FIG. 21 in that second nitride semiconductor layer 149 in high carrier concentration semiconductor layer 148 just below electrode portion 135 has a bandgap wider than second nitride semiconductor layer 132 in semiconductor layer stacked body 138. Other configurations including the finger structure are the same as those of the diode shown in the second exemplary embodiment (refer to FIGS. 14, 15A, and 15B, and Table 2).

With this configuration, high carrier concentration semiconductor layer 148 can be increased in sheet carrier concentration, so that when a reverse bias is applied to second electrode 133 serving as the cathode electrode, a large current can flow from first electrode 137 serving as the anode electrode to second electrode 133 serving as the cathode electrode.

In addition, when an n-impurity concentration of first nitride semiconductor layer 152 is set higher than that of first nitride semiconductor layer 131 in semiconductor layer stacked body 138, the sheet carrier concentration can be high, which is more favorable. As a matter of course, first nitride semiconductor layer 152 may have the same composition and the same thickness as first nitride semiconductor layer 131 in semiconductor layer stacked body 138.

Variation 8

Figure 23A:
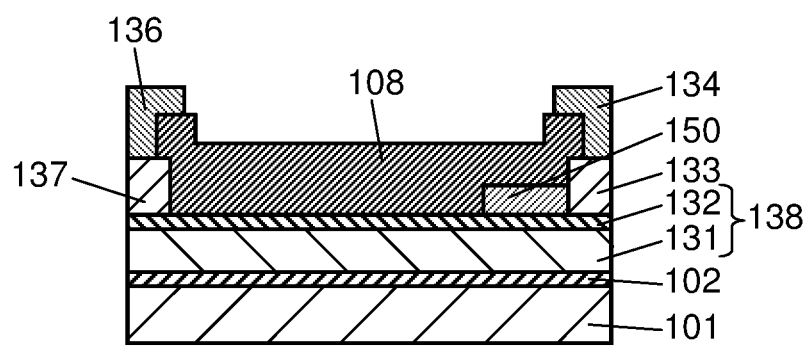
FIG. 23A is a cross-sectional view showing a semiconductor device according to Variation 8 of the second exemplary embodiment of the present disclosure.

FIG. 23A is a cross-sectional view of a diode in Variation 8 of this exemplary embodiment.

This diode differs from the diode shown in FIG. 14 in that a side surface of electrode portion 150 is in contact with second electrode 133 serving as the cathode electrode. Other configurations including the finger structure are the same as those of the diode shown in the second exemplary embodiment (refer to FIGS. 14, 15A, and 15B, and Table 2).

In this case, a cell pitch of the diode can be reduced, so that a chip size can be miniaturized.

Variation 8-2

Figure 23B:
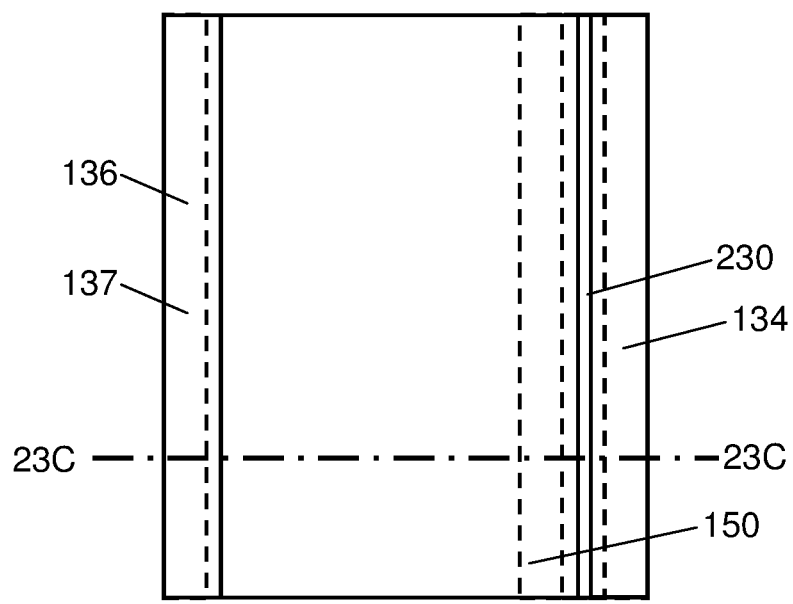
FIG. 23B is a perspective view showing a semiconductor device taken from above according to Variation 8-2 of the second exemplary embodiment of the present disclosure.
Figure 23C:
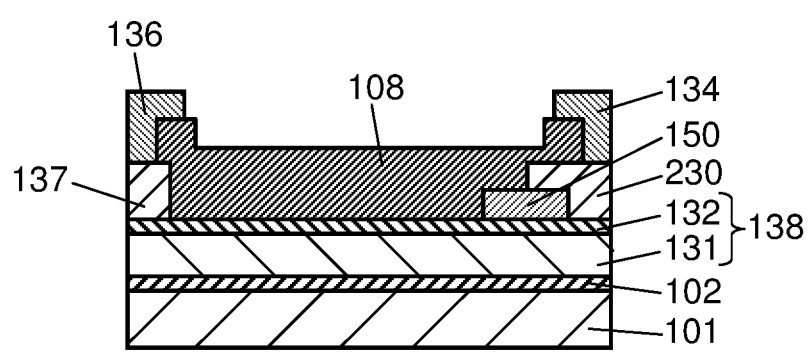
FIG. 23C is a cross-sectional view showing the semiconductor device according to Variation 8-2 of the second exemplary embodiment of the present disclosure.

FIG. 23B is a plan view of a diode in Variation 8-2 of this exemplary embodiment taken from above. FIG. 23C is a cross-sectional view of the diode in Variation 8-2 of this exemplary embodiment and shows a cross-sectional surface taken along line 23C-23C in FIG. 23B.

This diode differs from the diode in Variation 8 shown in FIG. 23A in that second electrode 230 hangs over electrode portion 150. In addition, electrode portion 150 forms a Schottky junction with second electrode 230. Other configurations including the finger structure are the same as those of the diode shown in Variation 8, and the diode shown in the second exemplary embodiment (refer to FIGS. 14 to 15B, and 23A, and Table 2).

In the above variation example, second electrode 230 can be made of a general material such as Ti/Al. Furthermore, second electrode 230 can serve as a wiring line of electrode portion 150. In this case, a process can be simplified and cost can be low, compared with a case where the wiring line of electrode portion 150 and second electrode 230 are separately formed.

In addition, second electrode 230 hangs over electrode portion 150, but in this case, an end of second electrode 230 is favorably formed so as not to exceed an end of electrode portion 150 on a side closer to the anode. This is because when the end of second electrode 230 goes beyond electrode portion 150, a potential difference is not likely to be formed between electrode portion 150 and second nitride semiconductor layer 132 just under electrode portion, and the potential difference does not become equal to or higher than an energy barrier even when the cathode voltage is increased, so that the current collapse is not effectively prevented.

Variation 8-3

Figure 23D:
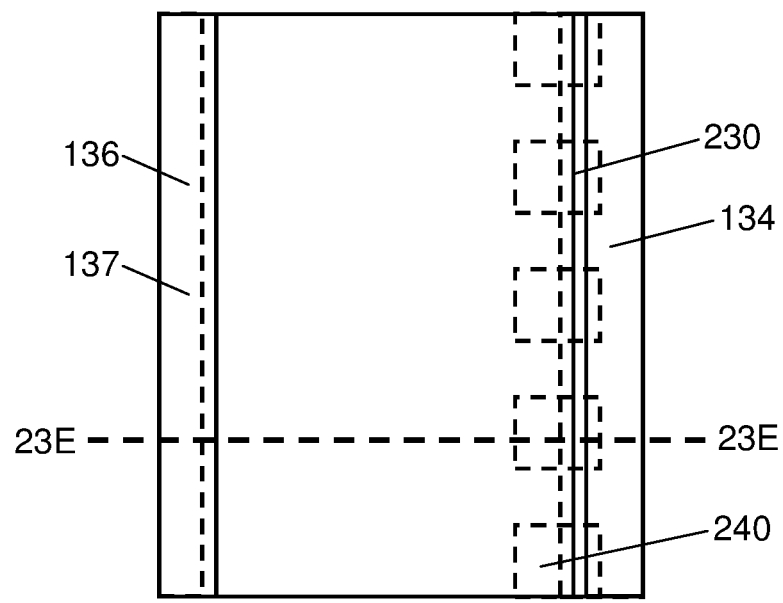
FIG. 23D is a perspective view showing a semiconductor device taken from above according to Variation 8-3 of the second exemplary embodiment of the present disclosure.
Figure 23E:
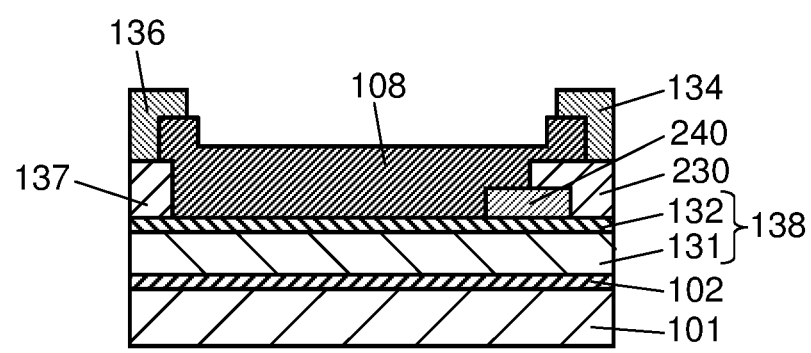
FIG. 23E is a cross-sectional view showing the semiconductor device according to Variation 8-3 of the second exemplary embodiment of the present disclosure.

FIG. 23D is a plan view of a diode in Variation 8-3 of this exemplary embodiment taken from above. FIG. 23E is a cross-sectional view of the diode in Variation 8-3 of this exemplary embodiment and shows a cross-sectional surface taken along line 23E-23E in FIG. 23D.

This diode differs from the diode in Variation 8-2 shown in FIGS. 23B and 23C in that plurality of island-shaped electrode portions 240 are separately formed so as to be spaced from each other when viewed from above. In addition, each of electrode portions 240 forms a Schottky junction with second electrode 230. Other configurations are the same as those of the diode shown in Variation 8-2.

In this variation example, since island-shaped electrode portions 240 are formed, a current flowing between first electrode 137 serving as the anode electrode and second electrode 230 serving as the cathode electrode also flows in a channel other than a channel under electrode portion 240. As a result, when a reverse bias is applied to second electrode 230 serving as the cathode electrode, a current flows so as to detour a depletion layer spreading under electrode portion 240, so that a larger current can flow into second electrode 230 serving as the cathode electrode.

Variation 8-4

Figure 23F:
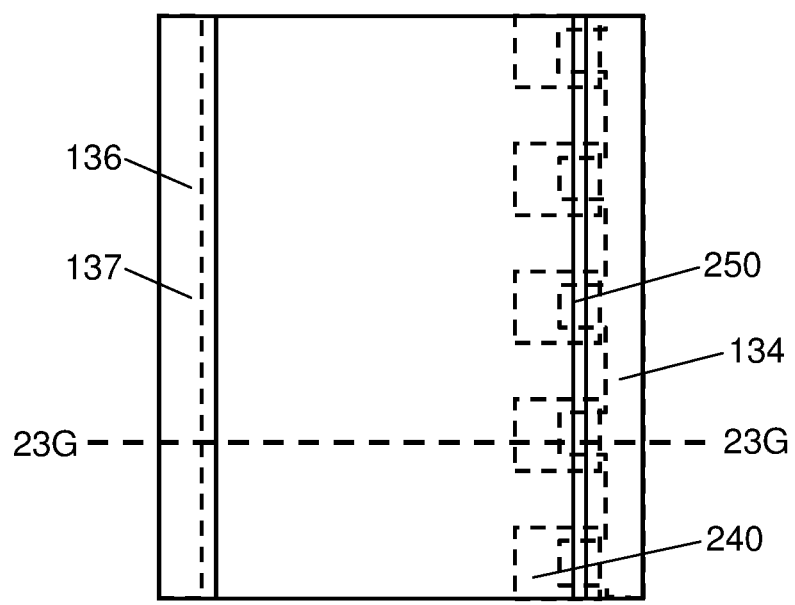
FIG. 23F is a perspective view showing a semiconductor device taken from above according to Variation 8-4 of the second exemplary embodiment of the present disclosure.
Figure 23G:
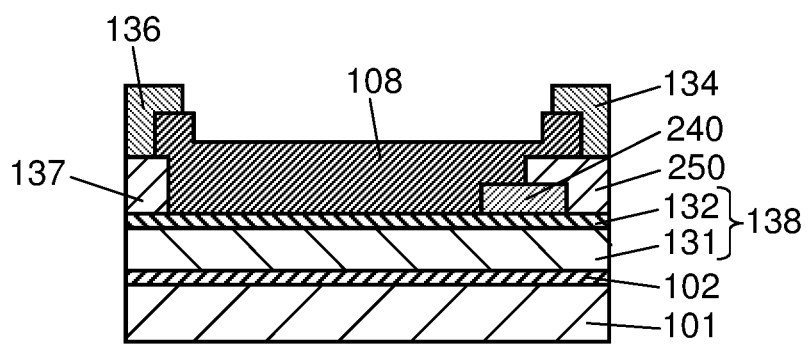
FIG. 23G is a cross-sectional view showing the semiconductor device according to Variation 8-4 of the second exemplary embodiment of the present disclosure.

FIG. 23F is a plan view of a diode in Variation 8-4 of this exemplary embodiment taken from above. FIG. 23G is a cross-sectional view of the diode in Variation 8-4 of this exemplary embodiment and shows a cross-sectional surface taken along line 23G-23G in FIG. 23F.

This diode differs from the diode in Variation 8-3 shown in FIGS. 23D and 23E in that along with plurality of island-shaped electrode portions 240, second electrode 250 is formed into a comb shape when viewed from above. Furthermore, second electrode 250 forms a Schottky junction with electrode portion 240. Other configurations are the same as those of the diode shown in Variation 8-3.

In the above variation example, since second electrode 250 is formed into the comb shape, second electrode 250 is not provided between adjacent island-shaped electrode portions 240 unlike Variation 8-3. Therefore, the current collapse can be more effectively prevented with electrode portion 240 than Variation 8-3.

Variation 9

Figure 24:
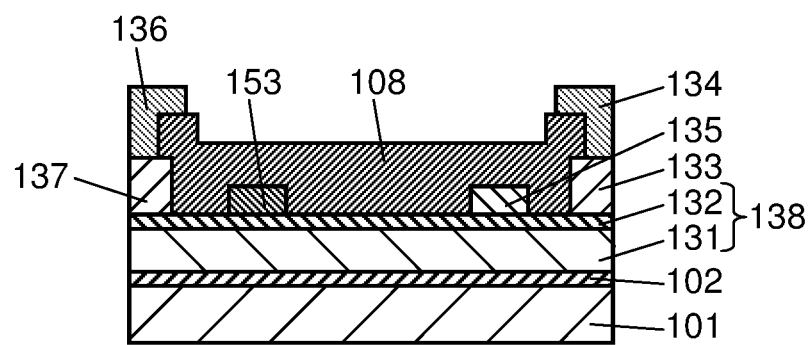
FIG. 24 is a cross-sectional view showing a semiconductor device according to Variation 9 of the second exemplary embodiment of the present disclosure.

FIG. 24 is a cross-sectional view of a diode in Variation 9 of this exemplary embodiment.

This diode differs from the diode shown in FIG. 14 in that second anode electrode 153 is provided. Other configurations including the finger structure are the same as those of the diode shown in the second exemplary embodiment (refer to FIGS. 14, 15A, and 15B, and Table 2).

Second anode electrode 153 is composed of a p-GaN layer having a thickness of about 200 nm, and connected to first electrode 137 serving as the anode electrode at a position not shown in FIG. 24.

This diode differs from the diode shown in FIG. 14 in that first electrode 137 serving as the anode electrode may not make a Schottky contact with semiconductor layer stacked body 138. When a high voltage is applied to second electrode 133 serving as the cathode electrode, a depletion layer is formed in the channel under second anode electrode 153 connected to first electrode 137 serving as the anode electrode, so that a current does not flow from second electrode 133 serving as the cathode electrode to first electrode 137 serving as the anode electrode. Meanwhile, when a reverse bias is applied to second electrode 133 serving as the cathode electrode, a channel is formed with 2DEG under second anode electrode 153 connected to first electrode 137 serving as the anode electrode, so that a current can flow from first electrode 137 serving as the anode electrode to second electrode 133 serving as the cathode electrode.

The present disclosure can be applied to the configuration shown in FIG. 24 with no problem.

In addition, according to this variation example, second anode electrode 153 is composed of the p-GaN layer, but second anode electrode 153 may be made of an electrode material such as nickel (Ni) which makes a Schottky contact with second nitride semiconductor layer 132.

In this variation example also, first electrode 137 serving as the anode electrode may make a Schottky contact with semiconductor layer stacked body 138 as a matter of course.

Furthermore, according to the second exemplary embodiment, first electrode 137 serving as the anode electrode, second anode electrode 153, and second electrode 133 serving as the cathode electrode are formed on semiconductor layer stacked body 138, but they may be formed on silicon substrate 101 as long as they are in contact with semiconductor layer stacked body 138.

Furthermore, according to the first and second exemplary embodiments, the Si substrate is used as the substrate, but the substrate may be a sapphire substrate, SiC substrate, GaN substrate, spinel substrate, or GaAs substrate other than the Si substrate. Furthermore, the main surface of the Si substrate has the plane orientation of (111) in the above description, but the plane orientation may be (001). Furthermore, in a case of a hexagonal substrate such as the GaN substrate, a main surface may have a plane orientation of (0001), (11-20), or (10-10).

Furthermore, as for buffer layer 102 having the multilayer structure composed of the AlN layer and the AlGaN layer in the first and second exemplary embodiments, the thicknesses of the AlN layer and the AlGaN layer, and an Al composition ratio are to be optimally selected, depending on a layer structure, a crystal growth condition, and a material of the substrate, in the semiconductor device to be manufactured. In this multilayer structure, the AlN layer and the AlGaN layer can be thick on a side of the substrate, and thin on a side of first nitride semiconductor layer 103. Furthermore, as for the composition of the AlGaN layer, the Al composition ratio may be high on the side of the substrate and the Al composition ratio may be lower on the side of first nitride semiconductor layer 103.

Furthermore, buffer layer 102 may be a superlattice buffer layer or a single layer made of AlN, AlGaN, or GaN occasionally.

The total thickness of buffer layer 102 is about 2.1 µm in the first and second exemplary embodiments, but it is not limited to about 2.1 µm depending on a configuration of buffer layer 102.

Furthermore, buffer layer 102, first nitride semiconductor layer 103 (or 131), and second nitride semiconductor layer 104 (or 132) are not limited to the ones described in the first and second exemplary embodiments, and x and y may be appropriately selected in nitride semiconductor layer $Al_x In_y Ga_{1-x-y}N$ ($0 \leq x \leq 1$, $0 \leq y \leq 1$) so as to realize a desired device characteristics.

Furthermore, the first electrode, the second electrode, and the third electrode are not limited to the ones described in the first and second exemplary embodiments. Especially, the third electrode may be made of rhodium.

Figure 25:
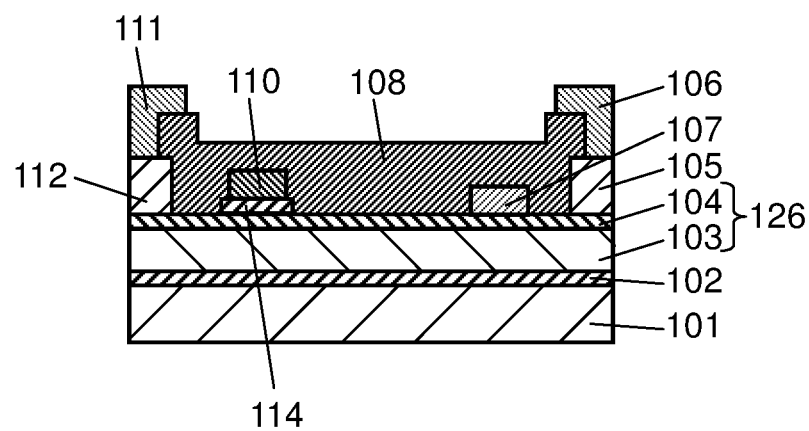
FIG. 25 is a cross-sectional view showing a semiconductor device according to another example of the first exemplary embodiment of the present disclosure.

Furthermore, the FET according to the first exemplary embodiment is not limited to the Schottky gate FET (MESFET (metal-semiconductor FET)), and it may be a MISFET (metal-insulator-semiconductor FET) using insulator layer 114 in a gate electrode portion as shown in FIG. 25. Furthermore, the FET may be a MOSFET (metal-oxide-semiconductor FET) using an oxide film as insulator layer 114 as a matter of course. Furthermore, insulator layer 114 may be made of silicon nitride (SiN), aluminum nitride (AlN), silicon oxide ($SiO_2$), silicon oxynitride (SiON), aluminum oxide ($Al_2O_3$), aluminum oxynitride (AlON), or titanium oxide ($TiO_2$). In addition, it may be a layer formed by thermally oxidizing second nitride semiconductor layer 104 selectively.

Figure 26:
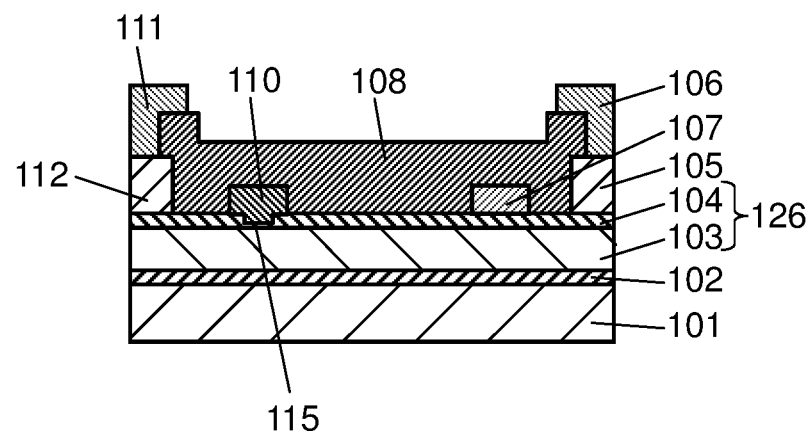
FIG. 26 is a cross-sectional view showing a semiconductor device according to another example of the first exemplary embodiment of the present disclosure.

Furthermore, as shown in FIG. 26, the FET according to the first exemplary embodiment may be a recessed gate FET having recess 115 formed in a gate electrode portion. In addition, it may be the MISFET or MOSFET having an insulator layer formed on a bottom of recess 115.

Figure 27:
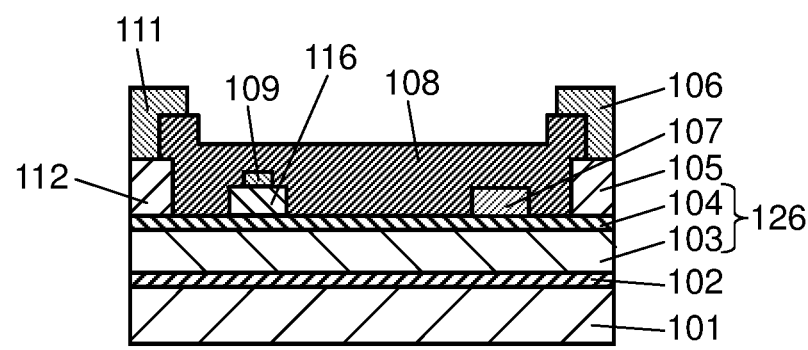
FIG. 27 is a cross-sectional view showing a semiconductor device according to another example of the first exemplary embodiment of the present disclosure.

Furthermore, as shown in FIG. 27, the FET according to the first exemplary embodiment may be a junction transistor (JFET) in which p-semiconductor layer 116 (made of p-GaN, p-AlGaN, or p-NiO) is formed in a gate electrode portion, and gate electrode 109 is formed on p-semiconductor layer 116.

Figure 28:
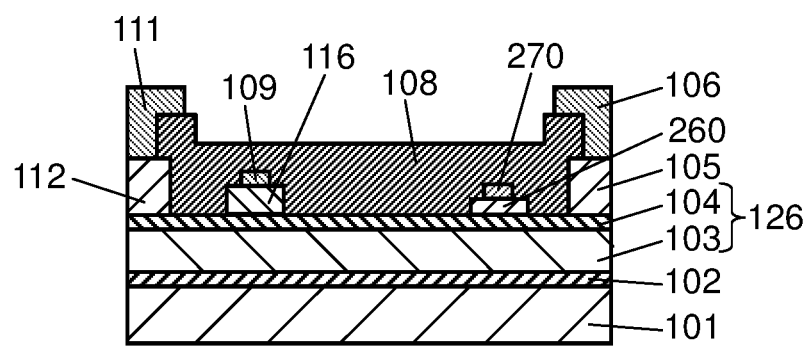
FIG. 28 is a cross-sectional view showing a semiconductor device according to another example of the first exemplary embodiment of the present disclosure.

Furthermore, as shown in FIG. 28, electrode portion 260 may be made of the same material as gate electrode portion 116 (such as p-GaN). In this case, gate electrode portion 116 and electrode portion 260 can be formed at the same time. Furthermore, gate electrode 109 and drain connection electrode 270 may be made of the same material and formed at the same time.

Furthermore, electrode portion 260 may be thinner than gate electrode portion 116. In this case, a higher electron concentration can be provided just under electrode portion 260, so that a larger current can flow between first electrode 112 and second electrode 105.

Still furthermore, an impurity concentration of electrode portion 260 may be lower than an impurity concentration of gate electrode portion 116. In this case, a higher electron concentration can be provided just under electrode portion 260, so that a larger current can flow between first electrode 112 and second electrode 105.

In addition, only one example is shown for each of the lengths, widths, thicknesses, and areas of the electrodes and the wiring lines in the first and second exemplary embodiments, and the values can vary depending on usage or purposes of the semiconductor device. Furthermore, only one example is shown for each of the materials of the electrodes and the wiring lines in the first and second exemplary embodiments, and the material can vary depending on the usage or purposes of the semiconductor device.

Furthermore, interlayer insulating film 108 is composed of the silicon nitride film in the first and second exemplary embodiments, but it may be composed of an organic insulating film made of aluminum nitride (AlN), silicon oxide ($SiO_2$), silicon oxynitride (SiON), aluminum oxide ($Al_2O_3$), aluminum oxynitride (AlON), titanium oxide ($TiO_2$), or polyimide. In addition, the thickness of interlayer insulating film 108 is not limited to 1 µm, and a value can vary depending on the usage and purposes of the semiconductor device.

The semiconductor device according to the present disclosure is the field effect device using the nitride semiconductor layer to prevent the current collapse, and can be usefully applied to a power device to be used in circuits such as an inverter or a power supply circuit.

What is claimed is:

1. A semiconductor device comprising:
   a substrate;
   a first nitride semiconductor layer provided on the substrate;
   a second nitride semiconductor layer provided on the first nitride semiconductor layer;
   a first electrode provided above a lower surface of the first nitride semiconductor layer and serving as a source electrode or an anode electrode;
   a second electrode provided above the lower surface of the first semiconductor layer and serving as a drain electrode or a cathode electrode;
   an electrode portion provided above a lower surface of the second nitride semiconductor layer; and
   an interlayer insulating film covering the second electrode, wherein:
   the interlayer insulating film partially has an opening and a second electrode wiring connected to the second electrode is provided in the opening,
   the first nitride semiconductor layer has a two-dimensional electron gas channel in a vicinity of an interface with the second nitride semiconductor layer,
   the first nitride semiconductor layer and the second nitride semiconductor layer form a semiconductor layer stacked body,
   the electrode portion is disposed between the first electrode and the second electrode, in plan view, an interface between the electrode portion and the second nitride semiconductor layer has an energy barrier indicating a rectifying function in a forward direction from the electrode portion to the second nitride semiconductor layer, a bandgap of the second nitride semiconductor layer is wider than a bandgap of the first nitride semiconductor layer, the electrode portion has a potential substantially equal to a potential of the second electrode, the two-dimensional electron gas channel under the electrode portion is in a conductive state between the first electrode and the second electrode, when a maximum operating voltage, which renders the first electrode positive with respect to the second electrode, is applied between the first electrode and the second electrode, a side surface and an upper surface of the electrode portion are in contact with the second electrode, and a first contact surface, in which the side surface of the electrode portion contacts to the second electrode, and a second contact surface, in which the upper surface of the electrode portion contacts to the second electrode, are continuous.

2. The semiconductor device according to claim 1, wherein the side surface of the electrode portion forms a Schottky contact with second electrode.

3. The semiconductor device according to claim 1, wherein the electrode portion forms a Schottky contact with second nitride semiconductor layer.

4. The semiconductor device according to claim 1, wherein an edge of the electrode portion on the first electrode side is provided at a position closer to the first electrode than an edge of the second electrode on the first electrode side on the electrode portion.

5. The semiconductor device according to claim 1, wherein an edge of the electrode portion on the first electrode side is provided at a position closer to the first electrode than an edge of the second electrode wiring on the first electrode side.

6. The semiconductor device according to claim 4, wherein the edge of the electrode portion on the first electrode side is provided at a position closer to the first electrode than the edge of the second electrode wiring on the first electrode side.

7. The semiconductor device according to claim 1, further comprising a gate electrode formed on the semiconductor layer stacked body and between the first electrode and the electrode portion with a space between the first electrode and the electrode portion, wherein:
the first electrode is a source electrode,
the second electrode is a drain electrode, and
the semiconductor device operates as a field effect transistor.

8. The semiconductor device according to claim 7, wherein:
when a second voltage lower than a breakdown voltage of the semiconductor device is applied between the source electrode and the drain electrode with a first voltage equal to or higher than a gate threshold voltage being applied to the gate electrode,
a potential difference between the electrode portion and the second nitride semiconductor layer just under the electrode portion reaches a value equal to or greater than the energy barrier, and a current flows from the electrode portion to the source electrode.

9. The semiconductor device according to claim 7, wherein:
under a forward bias condition, in which the drain electrode is positively biased with respect to the source electrode, when a positive voltage is applied to the gate electrode with respect to the source electrode, a drain current flows from the drain electrode to the source electrode, and
under a reverse bias condition, in which the source electrode is positively biased with respect to the drain electrode, when a positive voltage is applied to the gate electrode with respect to the drain electrode, a source current flows from the source electrode to the drain electrode and current flows bidirectional.

10. The semiconductor device according to claim 8, wherein:
under a forward bias condition, in which the drain electrode is positively biased with respect to the source electrode, when a positive voltage is applied to the gate electrode with respect to the source electrode, a drain current flows from the drain electrode to the source electrode, and
under a reverse bias condition, in which the source electrode is positively biased with respect to the drain electrode, when a positive voltage is applied to the gate electrode with respect to the drain electrode, a source current flows from the source electrode to the drain electrode and current flows bidirectional.

* * * * *